(12) United States Patent
Fujiki et al.

(10) Patent No.: US 11,173,694 B2
(45) Date of Patent: Nov. 16, 2021

(54) LAMINATE, MANUFACTURING METHOD OF LAMINATE, AND IMAGE DISPLAY DEVICE

(71) Applicant: FUJIFILM Corporation, Tokyo (JP)

(72) Inventors: Yuzo Fujiki, Kanagawa (JP); Yasukazu Kuwayama, Kanagawa (JP); Jun Takeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 166 days.

(21) Appl. No.: 16/720,502

(22) Filed: Dec. 19, 2019

(65) Prior Publication Data

US 2020/0139691 A1 May 7, 2020

Related U.S. Application Data

(63) Continuation of application No. PCT/JP2018/027851, filed on Jul. 25, 2018.

(30) Foreign Application Priority Data

Jul. 26, 2017 (JP) .............................. JP2017-144959

(51) Int. Cl.
*B32B 27/20* (2006.01)
*B32B 27/30* (2006.01)
(Continued)

(52) U.S. Cl.
CPC ............ *B32B 27/308* (2013.01); *B32B 7/023* (2019.01); *B32B 7/027* (2019.01); *B32B 27/20* (2013.01);
(Continued)

(58) Field of Classification Search
CPC .................. B32B 1/00; B32B 2305/55; B32B 2307/306; B32B 2307/412;
(Continued)

(56) References Cited

U.S. PATENT DOCUMENTS

| 2015/0337203 | A1 | 11/2015 | Hida et al. |
| 2016/0340367 | A1 | 11/2016 | Katoh et al. |
| 2017/0123124 | A1 | 5/2017 | Hatanaka et al. |

FOREIGN PATENT DOCUMENTS

| JP | 2011-221186 A | 11/2011 |
| JP | 2016-006502 A | 1/2016 |

(Continued)

OTHER PUBLICATIONS

Notice of Reasons for Refusal issued by the Japanese Patent Office dated Jul. 13, 2021, in connection with Japanese Patent Application No. 2019-532825.

(Continued)

*Primary Examiner* — Lawrence D Ferguson
(74) *Attorney, Agent, or Firm* — Jean C. Edwards, Esq.; Edwards Neils LLC

(57) ABSTRACT

An object of the present invention is to provide a laminate in which an excellent alignment property of a dichroic substance is maintained and which is excellent in both high-temperature durability and moisture-heat resistance, a manufacturing method of the laminate, and an image display device using the laminate. A laminate according to an embodiment of the present invention is a laminate having a transparent support, a light absorption anisotropic film, and a transparent resin layer in this order, in which the light absorption anisotropic film is a film containing a dichroic substance represented by a predetermined formula, and the transparent resin layer is a layer containing a polymer which has a hydrophilic group and does not have a glass transition temperature in a temperature range of 95° C. or lower.

20 Claims, 1 Drawing Sheet

(51) Int. Cl.
*B32B 7/023* (2019.01)
*B32B 7/027* (2019.01)
*C08K 5/46* (2006.01)
*G02F 1/1337* (2006.01)

(52) U.S. Cl.
CPC .......... *C08K 5/46* (2013.01); *G02F 1/133723* (2013.01); *B32B 2305/55* (2013.01); *B32B 2307/306* (2013.01); *B32B 2307/412* (2013.01); *B32B 2307/42* (2013.01); *B32B 2307/706* (2013.01); *B32B 2307/7246* (2013.01); *B32B 2457/20* (2013.01)

(58) Field of Classification Search
CPC .......... B32B 2307/42; B32B 2307/706; B32B 2307/7246; B32B 2457/20; B32B 27/20; B32B 27/308; B32B 7/023; B32B 7/027; C08K 5/46; G02B 5/30; G02F 1/133528; G02F 1/133723; H01L 27/32; H01L 51/50; H05B 33/02
See application file for complete search history.

(56) References Cited

FOREIGN PATENT DOCUMENTS

JP 2016-216637 A 12/2016
JP 2017-083843 A 5/2017

OTHER PUBLICATIONS

International Search Report issued in PCT/JP2018/027851 dated Oct. 16, 2018.
Written Opinion issued in PCT/JP2018/027851 dated Oct. 16, 2018.
International Preliminary Report on Patentability completed by WIPO dated Jan. 28, 2020 in connection with International Patent Application No. PCT/JP2018/027851.
Notice of Reasons for Refusal issued by the Japanese Patent Office dated Jun. 9, 2020, in connection with Japanese Patent Application No. 2019-532825.
Notice of Reasons for Refusal issued by the Japanese Patent Office dated Feb. 2, 2021, in connection with Japanese Patent Application No. 2019-532825.
Notice of Reasons for Refusal issued by the Japanese Patent Office dated Oct. 5, 2021, in connection with Japanese Patent Application No. 2019-532825.

LAMINATE, MANUFACTURING METHOD OF LAMINATE, AND IMAGE DISPLAY DEVICE

CROSS-REFERENCE TO RELATED APPLICATIONS

This application is a Continuation of PCT International Application No. PCT/JP2018/027851 filed on Jul. 25, 2018, which was published under PCT Article 21(2) in Japanese, and which claims priority under 35 U.S.C. § 119(a) to Japanese Patent Application No. 2017-144959 filed on Jul. 26, 2017. The above applications are hereby expressly incorporated by reference, in their entirety, into the present application.

BACKGROUND OF THE INVENTION

1. Field of the Invention

The present invention relates to a laminate, a manufacturing method of the laminate, and an image display device.

2. Description of the Related Art

In the past, devices which are operated by different principles for each function have been used in a case where an attenuation function, a polarization function, a scattering function, a shielding function, or the like is required in relation to irradiated light including laser light and natural light. Therefore, products corresponding to the above-described functions have been manufactured through different manufacturing processes for each function.

For example, in liquid crystal displays (LCDs), a linearly polarizing plate or a circularly polarizing plate is used to control optical activity and a birefringent property in display. In addition, in organic light emitting diodes (OLEDs), a circularly polarizing plate is used to prevent external light from being reflected.

Iodine has been widely used as a dichroic substance in these polarizing plates (polarizing elements). However, a polarizing element using an organic dye as a dichroic substance instead of iodine has also been examined.

For example, JP2016-006502A describes a polarizing film formed from a composition containing a predetermined azo dye and a polymerizable liquid crystal compound ([claim 1]).

SUMMARY OF THE INVENTION

The inventors have studied the polarizing film described in JP2016-006502A, and found that although the polarizing film is excellent in initial alignment property (hereinafter, simply referred to as "alignment property") of the azo dye, the high-temperature durability and the moisture-heat resistance deteriorate depending on the layer configuration of the laminate including the polarizing film.

Accordingly, an object of the present invention is to provide a laminate in which an excellent alignment property of a dichroic substance is maintained and which is excellent in both high-temperature durability and moisture-heat resistance, a manufacturing method of the laminate, and an image display device using the laminate.

The inventors have conducted intensive studies in order to achieve the above object, and as a result, found that a laminate in which an excellent alignment property of a dichroic substance is maintained and which is excellent in both high-temperature durability and moisture-heat resistance is obtained by providing a transparent resin layer containing a polymer which has a hydrophilic group and does not have a glass transition temperature in a temperature range of 95° C. or lower, together with a light absorption anisotropic film containing a dichroic substance having a predetermined structural formula, and completed the present invention.

That is, the inventors have found that the object can be achieved with the following configuration.

[1] A laminate comprising, in this order: a transparent support; a light absorption anisotropic film; and a transparent resin layer, in which the light absorption anisotropic film is a film containing a dichroic substance represented by Formula (1), and the transparent resin layer is a layer containing a polymer which has a hydrophilic group and does not have a glass transition temperature in a temperature range of 95° C. or lower.

[2] The laminate according to [1], in which a content of the polymer in the transparent resin layer is 30 mass % or greater with respect to a total mass of a total solid content of the transparent resin layer.

[3] The laminate according to [1] or [2], in which the polymer in the transparent resin layer is a polymer in which a ratio of the number of the hydrophilic groups to the number of carbon atoms having a C—H bond is 0.05 to 0.45.

[4] The laminate according to any one of [1] to [3], in which a water contact angle of a surface of the transparent resin layer opposite to the light absorption anisotropic film is 25° or greater and 60° or less.

[5] The laminate according to any one of [1] to [4], in which the light absorption anisotropic film is a film formed using a liquid crystal composition containing the dichroic substance and a liquid crystalline compound.

[6] The laminate according to any one of [1] to [5], further comprising: an alignment film provided between the transparent support and the light absorption anisotropic film.

[7] The laminate according to [6], in which the alignment film is a photo-alignment film formed using a composition containing a photo-alignment compound, the photo-alignment compound is a photosensitive compound having a photoreactive group which generates at least one of dimerization or isomerization by the action of light, and the photoreactive group has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

[8] The laminate according to any one of [1] to [7], in which the dichroic substance has a structure represented by Formula (2).

[9] The laminate according to [8], in which in Formula (2), $A^4$ is a phenylene group.

[10] The laminate according to [8] or [9], in which in Formula (2), at least one of $L^3$ or $L^4$ contains a crosslinking group.

[11] The laminate according to any one of [8] to [10], in which in Formula (2), both $L^3$ and $L^4$ contain a crosslinking group.

[12] The laminate according to [10] or [11], in which the crosslinking group is an acryloyl group or a methacryloyl group.

[13] The laminate according to any one of [1] to [12], further comprising: a pressure sensitive layer provided on a side of the transparent resin layer opposite to the light absorption anisotropic film.

[14] The laminate according to [13], further comprising: a λ/4 plate provided on a side of the pressure sensitive layer opposite to the transparent resin layer.

[15] A manufacturing method of a laminate which has a transparent support, a light absorption anisotropic film, and a transparent resin layer in this order, the method comprising:

a light absorption anisotropic film forming step of forming a light absorption anisotropic film using a liquid crystal composition containing a dichroic substance represented by Formula (1) on a transparent support; and a transparent resin layer forming step of forming a transparent resin layer containing a polymer which has a hydrophilic group and does not have a glass transition temperature in a temperature range of 95° C. or lower using a curable composition containing a polymerizable compound having a hydrophilic group on the light absorption anisotropic film.

[16] The manufacturing method of a laminate according to [15], in which a C log P value of the polymerizable compound is less than 2.0.

[17] The manufacturing method of a laminate according to [16], in which the polymerizable compound is a compound in which a ratio of the number of the hydrophilic groups to the number of carbon atoms having a C—H bond is 0.05 to 0.45.

[18] An image display device comprising: the laminate according to any one of [1] to [14].

According to the present invention, it is possible to provide a laminate in which an excellent alignment property of a dichroic substance is maintained and which is excellent in both high-temperature durability and moisture-heat resistance, a manufacturing method of the laminate, and an image display device using the laminate.

DESCRIPTION OF THE PREFERRED EMBODIMENTS

Figure 1A:
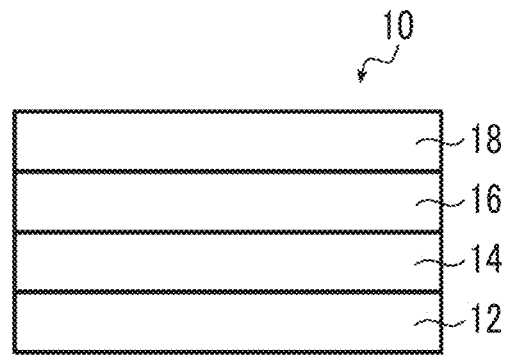
FIG. 1A is a schematic cross-sectional view showing an example of a laminate according to an embodiment of the present invention.

Hereinafter, the present invention will be described.

The following description of constituent requirements is based on typical embodiments of the present invention, but the present invention is not limited thereto.

In this specification, a numerical value range expressed using "to" means a range including numerical values before and after "to" as a lower limit value and an upper limit value.

Regarding the respective components, substances corresponding to the respective components may be used alone or in combination of two or more kinds thereof. Here, in a case where two or more kinds of substances are used in combination regarding the respective components, the content of the component refers to the total content of the substances used in combination unless otherwise specified.

[Laminate]

A laminate according to an embodiment of the present invention is a laminate having a transparent support, a light absorption anisotropic film, and a transparent resin layer in this order.

The light absorption anisotropic film of the laminate according to the embodiment of the present invention is a film containing a dichroic substance represented by Formula (1).

The transparent resin layer of the laminate according to the embodiment of the present invention is a layer containing a polymer which has a hydrophilic group and does not have a glass transition temperature in a temperature range of 95° C. or lower.

Here, the term "transparent" in the present invention indicates that the visible light transmittance is 60% or greater, and the visible light transmittance is preferably 80% or greater, and particularly preferably 90% or greater.

In the present invention, as described above, a laminate in which an excellent alignment property of a dichroic substance is maintained and which is excellent in both high-temperature durability and moisture-heat resistance is obtained by providing a transparent resin layer containing a polymer which has a hydrophilic group and does not have a glass transition temperature in a temperature range of 95° C. or lower, together with a light absorption anisotropic film containing a dichroic substance represented by Formula (1).

Although the reason for this has not yet been clarified in detail, it is presumed by the present inventors as follows.

First, the inventors have investigated a cause of deterioration of high-temperature durability and moisture-heat resistance in a conventionally known polarizing element (polarizing film) using an organic dye as a dichroic substance, and found that in a case where another functional layer (for example, a retardation film or the like) is bonded to the polarizing element, the high-temperature durability and the moisture-heat resistance significantly deteriorate in the formation of a pressure sensitive layer on the polarizing element.

Accordingly, in the present invention, it is thought that transfer of the dichroic dye to another functional layer or the pressure sensitive layer is suppressed by providing a predetermined transparent resin layer containing a polymer which has a hydrophilic group and does not have a glass transition temperature in a temperature range of 95° C. or lower, and as a result, an excellent alignment property of the dichroic substance is maintained, and the high-temperature durability and the moisture-heat resistance are improved.

Figure 1B:
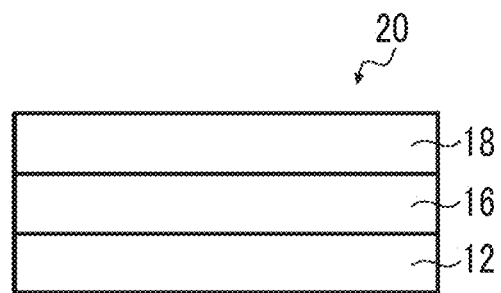
FIG. 1B is a schematic cross-sectional view showing an example of a laminate according to an embodiment of the present invention.

FIGS. 1A and 1B show schematic cross-sectional views showing an example of the laminate according to the embodiment of the present invention.

Here, a laminate 10 shown in FIG. 1A has a layer configuration having a transparent support 12, an alignment film 14, a light absorption anisotropic film 16, and a transparent resin layer 18 in this order (hereinafter, also abbreviated as "configuration A").

A laminate 20 shown in FIG. 1B has a layer configuration having a transparent support 12, a light absorption anisotropic film 16, and a transparent resin layer 18 in this order (hereinafter, also abbreviated as "configuration B").

Figure 1C:
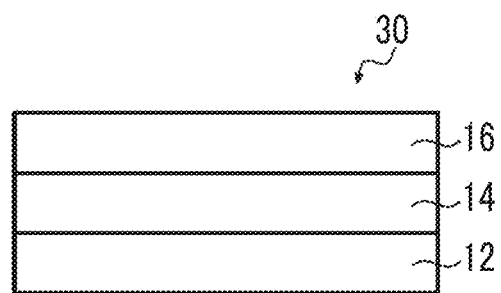
FIG. 1C is a schematic cross-sectional view showing a laminate of Comparative Example 1.

FIG. 1C is a schematic cross-sectional view of a laminate of Comparative Example 1, and a laminate 30 shown in FIG. 1C has a layer configuration having a transparent support 12, an alignment film 14, and a light absorption anisotropic film 16 in this order (hereinafter, also abbreviated as "configuration C").

Hereinafter, the transparent support, the light absorption anisotropic film, the transparent resin layer, and the optional alignment film of the laminate according to the embodiment of the present invention will be described in detail.

[Transparent Support]

Examples of the material which forms the transparent support of the laminate according to the embodiment of the present invention include polycarbonate polymers; polyester polymers such as polyethylene terephthalate (PET) and polyethylene naphthalate; acrylic polymers such as polymethyl methacrylate; styrene polymers such as polystyrene and acrylonitrile/styrene copolymer (AS resin); polyolefin polymers such as polyethylene, polypropylene, and ethylene/propylene copolymer; vinyl chloride polymers; amide polymers such as nylon and aromatic polyamide; imide polymers; sulfone polymers; polyethersulfone polymers; polyetheretherketone polymers; polyphenylene sulfide polymers; vinylidene chloride polymers; vinyl alcohol polymers; vinyl butyral polymers; arylate polymers; polyoxymethylene polymers; and epoxy polymers.

Thermoplastic norbornene resins can be preferably used as a material which forms the transparent support. Examples of the thermoplastic norbornene resins include ZEONEX and ZEONOR manufactured by ZEON CORPORATION, and ARTON manufactured JSR Corporation.

Cellulose polymers represented by triacetyl cellulose (TAC) can also be preferably used as a material which forms the transparent support.

In the present invention, the thickness of the transparent support is not particularly limited. The thickness is preferably 100 μm or less, more preferably 80 μm or less, and even more preferably 10 to 80 μm.

[Light Absorption Anisotropic Film]

The light absorption anisotropic film of the laminate according to the embodiment of the present invention is a film containing a dichroic substance represented by Formula (1) (hereinafter, also abbreviated as "specific dichroic substance").

  (1)

Here, in Formula (1), $A^1$, $A^2$, and $A^3$ each independently represent a divalent aromatic group which may have a substituent.

In Formula (1), $L^1$ and $L^2$ each independently represent a substituent.

In Formula (1), m represents an integer of 1 to 4, and in a case where m is an integer of 2 to 4, a plurality of $A^2$'s may be the same as or different. m is preferably 1 or 2.

The "divalent aromatic group which may have a substituent" represented by $A^1$, $A^2$, and $A^3$ in Formula (1) will be described.

Examples of the substituent include the substituent group G described in paragraphs [0237] to [0240] of JP2011-237513A. Among these, a halogen atom, an alkyl group, an alkoxy group, an alkoxycarbonyl group (for example, methoxycarbonyl and ethoxycarbonyl), an aryloxycarbonyl group (for example, phenoxycarbonyl, 4-methylphenoxycarbonyl, and 4-methoxyphenylcarbonyl), and the like are preferable, an alkyl group is more preferable, and an alkyl group having 1 to 5 carbon atoms is even more preferable.

Examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

The divalent aromatic heterocyclic group is preferably a monocyclic or bicyclic heterocyclic ring-derived group. Examples of atoms other than carbon of the aromatic heterocyclic group include a nitrogen atom, a sulfur atom, and an oxygen atom. In a case where the aromatic heterocyclic group has a plurality of ring-constituent atoms other than carbon, these may be the same or different. Specific examples of the aromatic heterocyclic group include a pyridylene group (pyridine-diyl group), a quinolylene group (quinoline-diyl group), an isoquinolylene group (isoquinoline-diyl group), a benzothiadiazole-diyl group, a phthalimide-diyl group, and a thienothiazole-diyl group (hereinafter, abbreviated as "thienothiazole group").

Among the divalent aromatic groups, a divalent aromatic hydrocarbon group is preferable.

Here, any one of $A^1$, $A^2$, or $A^3$ is preferably a divalent thienothiazole group which may have a substituent. Specific examples and preferable aspects of the substituent of the divalent thienothiazole group are the same as those of the substituent in the "divalent aromatic group which may have a substituent".

It is more preferable that among $A^1$, $A^2$, and $A^3$, $A^2$ is a divalent thienothiazole group. In this case, $A^1$ and $A^2$ represent a divalent aromatic group which may have a substituent.

In a case where $A^2$ is a divalent thienothiazole group, it is preferable that at least one of $A^1$ or $A^2$ is a divalent aromatic hydrocarbon group which may have a substituent, and it is more preferable that both $A^1$ and $A^2$ are divalent aromatic hydrocarbon groups which may have a substituent.

In Formula (1), the "substituent" represented by $L^1$ and $L^2$ will be described.

As the substituent, a group having a group introduced to increase solubility or nematic liquid crystallinity, a group introduced to adjust a tone as a dye and having an electron-donating property or an electron-withdrawing property, or a crosslinking group (polymerizable group) introduced to fix the alignment is preferable.

Examples of the substituent include an alkyl group (an alkyl group preferably having 1 to 20 carbon atoms, more preferably 1 to 12 carbon atoms, and particularly preferably 1 to 8 carbon atoms, e.g., a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (an alkenyl group preferably having 2 to 20 carbon atoms, more preferably 2 to 12 carbon atoms, and particularly preferably 2 to 8 carbon atoms, e.g., a vinyl group, an aryl group, a 2-butenyl group, and a 3-pentenyl group), an alkynyl group (an alkynyl group preferably having 2 to 20 carbon atoms, more preferably 2 to 12 carbon atoms, and particularly preferably 2 to 8 carbon atoms, e.g., a propargyl group and a 3-pentynyl group), an aryl group (an aryl group preferably having 6 to 30 carbon atoms, more preferably 6 to 20 carbon atoms, and particularly preferably 6 to 12 carbon atoms, e.g., a phenyl group, a 2,6-diethylphenyl group, a 3,5-ditrifluoromethylphenyl group, a styryl group, a naphthyl group, and a biphenyl group), a substituted or unsubstituted amino group (an amino group preferably having 0 to 20 carbon atoms, more preferably 0 to 10 carbon atoms, and particularly preferably 0 to 6 carbon atoms, e.g., an unsubstituted amino group, a methylamino group, a dimethylamino group, a diethylamino group, and an anilino group), an alkoxy group (preferably having 1 to 20 carbon atoms, and more preferably 1 to 15 carbon atoms, e.g., a methoxy group, an ethoxy group, and a butoxy group), an oxycarbonyl group (preferably having 2 to 20 carbon atoms, more preferably 2 to 15 carbon atoms, and particularly preferably 2 to 10 carbon atoms, e.g., a methoxycarbonyl group, an ethoxycarbonyl group, and a phenoxycarbonyl group), an acyloxy group (preferably having 2 to 20 carbon atoms, more preferably 2 to 10 carbon atoms, and particularly preferably 2 to 6 carbon atoms, e.g., an acetoxy group, a benzoyloxy group, an acryloyl group, and a methacryloyl group), an acylamino group (preferably having 2 to 20 carbon atoms, more preferably 2 to 10 carbon atoms, and particularly preferably 2 to 6 carbon atoms, e.g., an acetylamino group and a benzoylamino group), an alkoxycarbonylamino group (preferably having 2 to 20 carbon atoms, more preferably 2 to 10 carbon atoms, and particularly preferably 2 to 6 carbon atoms, e.g., a methoxycarbonylamino group), an aryloxycarbonylamino group (preferably having 7 to 20 carbon atoms, more preferably 7 to 16 carbon atoms, and particularly preferably 7 to 12 carbon atoms, e.g., a phenyloxycarbonylamino group), a sulfonylamino group (preferably having 1 to 20 carbon atoms, more preferably 1 to 10 carbon atoms, and particularly preferably 1 to 6 carbon atoms, e.g., a methanesulfonylamino group and a benzenesulfonylamino group), a sulfamoyl group (preferably having 0 to 20 carbon atoms, more preferably 0 to 10 carbon atoms, and particularly preferably 0 to 6 carbon atoms, e.g., a sulfamoyl group, a methylsulfamoyl group, a dimethylsulfamoyl group, and a phenylsulfamoyl group), a carbamoyl group (preferably having 1 to 20 carbon atoms, more preferably 1 to 10 carbon atoms, and particularly preferably 1 to 6 carbon atoms, e.g., an unsubstituted carbamoyl group, a methylcarbamoyl group, a diethylcarbamoyl group, and a phenylcarbamoyl group), an alkylthio group (preferably having 1 to 20 carbon atoms, more preferably 1 to 10 carbon atoms, and particularly preferably 1 to 6 carbon atoms, e.g., a methylthio group and an ethylthio group), an arylthio group (preferably having 6 to 20 carbon atoms, more preferably 6 to 16 carbon atoms, and particularly preferably 6 to 12 carbon atoms, e.g., a phenylthio group), a sulfonyl group (preferably having 1 to 20 carbon atoms, more preferably 1 to 10 carbon atoms, and particularly preferably 1 to 6 carbon atoms, e.g., a mesyl group and a tosyl group), a sulfinyl group (preferably having 1 to 20 carbon atoms, more preferably 1 to 10 carbon atoms, and particularly preferably 1 to 6 carbon atoms, e.g., a methanesulfinyl group and a benzenesulfinyl group), a ureido group (preferably having 1 to 20 carbon atoms, more preferably 1 to 10 carbon atoms, and particularly preferably 1 to 6 carbon atoms, e.g., an unsubstituted ureido group, a methylureido group, and a phenylureido group), a phosphoric acid amide group (preferably having 1 to 20 carbon atoms, more preferably 1 to 10 carbon atoms, and particularly preferably 1 to 6 carbon atoms, e.g., a diethylphosphoric acid amide group and a phenylphosphoric acid amide group), a hydroxy group, a mercapto group, a halogen atom (for example, a fluorine atom, a chlorine atom, a bromine atom, and an iodine atom), a cyano group, a nitro group, a hydroxamic group, a sulfino group, a hydrazino group, an imino group, an azo group, a heterocyclic group (a heterocyclic group preferably having 1 to 30 carbon atoms, and more preferably 1 to 12 carbon atoms, e.g., a heterocyclic group having a hetero atom such as a nitrogen atom, an oxygen atom, or a sulfur atom, such as an epoxy group, an oxetanyl group, an imidazolyl group, a pyridyl group, a quinolyl group, a furyl group, a piperidyl group, a morpholino group, a benzoxazolyl group, a benzimidazolyl group, and a benzthiazolyl group), a silyl group (a silyl group preferably having 3 to 40 carbon atoms, more preferably 3 to 30 carbon atoms, and particularly preferably 3 to 24 carbon atoms. e.g., a trimethylsilyl group and a triphenylsilyl group).

These substituents may be further substituted by the above substituents. In a case where two or more substituents are provided, the substituents may be the same or different. The substituents may be bonded to each other to form a ring.

The substituent represented by $L^1$ and $L^2$ is preferably an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxy group, a cyano group, an imino group, an azo group, a halogen atom, or a heterocyclic group, and more preferably an alkyl group which may have a substituent, an alkenyl group which may have a substituent, an aryl group which may have a substituent, an alkoxy group which may have a substituent, an oxycarbonyl group which may have a substituent, an acyloxy group which may have a substituent, an amino group which may have a substituent, a nitro group, an imino group, or an azo group.

It is preferable that at least one of $L^1$ or $L^2$ contains a crosslinking group (polymerizable group), and it is more preferable that both $L^1$ and $L^2$ contain a crosslinking group.

Specific examples of the crosslinking group include the polymerizable groups described in paragraphs [0040] to [0050] of JP2010-244038A. From the viewpoint of reactivity and synthesis suitability, an acryloyl group, a methacryloyl group, an epoxy group, an oxetanyl group, and a styryl group are preferable, and an acryloyl group and a methacryloyl group are more preferable.

Examples of preferable aspects of $L^1$ and $L^2$ include an alkyl group substituted by the crosslinking group, a dialkylamino group substituted by the crosslinking group, and an alkoxy group substituted by the crosslinking group.

In the present invention, the specific dichroic substance preferably has a structure represented by Formula (2) since the alignment degree of the specific dichroic substance contained in the light absorption anisotropic film is further improved.

(2)

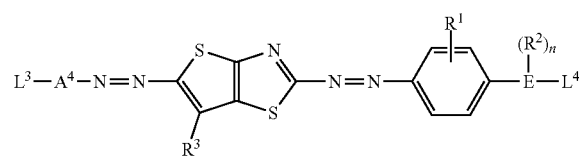

Here, in Formula (2), $A^4$ represents a divalent aromatic group which may have a substituent.

In Formula (2), $L^3$ and $L^4$ each independently represent a substituent.

In Formula (2), E represents any one of a nitrogen atom, an oxygen atom, or a sulfur atom.

In Formula (2), $R^1$ represents any one of a hydrogen atom, a halogen atom, an alkyl group which may have a substituent, or an alkoxy group which may have a substituent.

In Formula (2), $R^2$ represents a hydrogen atom or an alkyl group which may have a substituent.

In Formula (2), $R^3$ represents a hydrogen atom or a substituent.

In Formula (2), n represents 0 or 1. In a case where E is a nitrogen atom, n is 1, and in a case where E is an oxygen atom or a sulfur atom, n is 0.

Specific examples and preferable aspects of the "divalent aromatic group which may have a substituent" represented by $A^4$ in Formula (2) are similar to those of the "divalent aromatic group which may have a substituent" represented by $A^1$ to $A^3$ in Formula (1).

A particularly preferable aspect of $A^4$ is a phenylene group.

Specific examples and preferable aspects of the "substituent" represented by $L^3$ and $L^4$ in Formula (2) are similar to those of the "substituent" represented by $L^1$ and $L^2$ in Formula (1).

A more preferable aspect of $L^3$ and $L^4$ is that at least one of $L^3$ or $L^4$ contains a crosslinking group, and an even more preferable aspect thereof is that both $L^3$ and $L^4$ contain a crosslinking group. Accordingly, the alignment degree of the specific dichroic substance contained in the light absorption anisotropic film is further improved, and the high-temperature durability and the moisture-heat resistance of the laminate are improved.

A more preferable aspect of the crosslinking group of $L^3$ and $L^4$ is an acryloyl group or a methacryloyl group.

In Formula (2), E represents any one of a nitrogen atom, an oxygen atom, or a sulfur atom, and is preferably a nitrogen atom from the viewpoint of synthesis suitability.

From the viewpoint of the fact that it is facilitated to allow the specific dichroic substance to have absorption on the short wavelength side (for example, having a maximum absorption wavelength at about 500 to 530 nm), E in Formula (1) is preferably an oxygen atom.

From the viewpoint of the fact that it is facilitated to allow the specific dichroic substance to have absorption on the long wavelength side (for example, having a maximum absorption wavelength at about 600 nm), E in Formula (1) is preferably a nitrogen atom.

In Formula (2), $R^1$ represents any one of a hydrogen atom, a halogen atom, an alkyl group which may have a substituent, or an alkoxy group which may have a substituent, and is preferably a hydrogen atom or an alkyl group which may have a substituent.

Next, the "alkyl group which may have a substituent" and the "alkoxy group which may have a substituent" represented by $R^1$ will be described.

Examples of the substituent include a halogen atom.

Examples of the alkyl group include linear, branched, or cyclic alkyl groups having 1 to 8 carbon atoms. Among these, a linear alkyl group having 1 to 6 carbon atoms is preferable, a linear alkyl group having 1 to 3 carbon atoms is more preferable, and a methyl group or an ethyl group is even more preferable.

Examples of the alkoxy group include alkoxy groups having 1 to 8 carbon atoms. Among these, an alkoxy group having 1 to 6 carbon atoms is preferable, an alkoxy group having 1 to 3 carbon atoms is more preferable, and a methoxy group or an ethoxy group is even more preferable.

In Formula (2), $R^2$ represents a hydrogen atom or an alkyl group which may have a substituent, and is preferably an alkyl group which may have a substituent.

Since specific examples and preferable aspects of the "alkyl group which may have a substituent" represented by $R^2$ are similar to those of the "alkyl group which may have a substituent" represented by $R^1$ of Formula (2), the description thereof will be omitted.

In a case where E is a nitrogen atom, $R^2$ is a group existing in Formula (2) (that is, n=1). In a case where E is an oxygen atom or a sulfur atom, $R^2$ is a group which does not exist in Formula (2) (that is, n=0).

In Formula (2), $R^3$ represents a hydrogen atom or a substituent.

Since specific examples and preferable aspects of the "substituent" represented by $R^3$ are the same as those of the substituent in the "divalent aromatic group which may have a substituent", the description thereof will be omitted.

In Formula (2), n represents 0 or 1. In a case where E is a nitrogen atom, n is 1, and in a case where E is an oxygen atom or a sulfur atom, n is 0.

Specific examples of the specific dichroic substance represented by Formula (1) include the compounds described in paragraphs [0051] to [0081] of JP2010-152351 A, and the contents thereof are incorporated herein.

Among these, preferable examples of the specific dichroic substance having a structure represented by Formula (2) include the compounds (D-1) to (D-53) described in paragraphs [0074] to [0081] of JP2010-152351A and the following compounds (D-54) to (D-58).

(D-53)

(D-54)

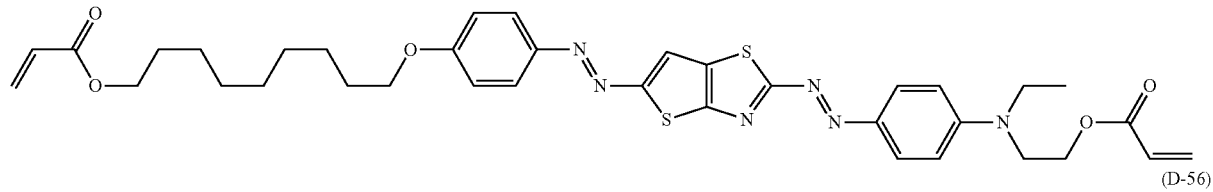

(D-55)

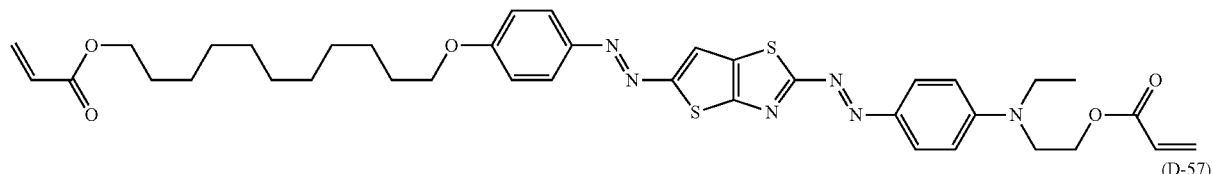

(D-56)

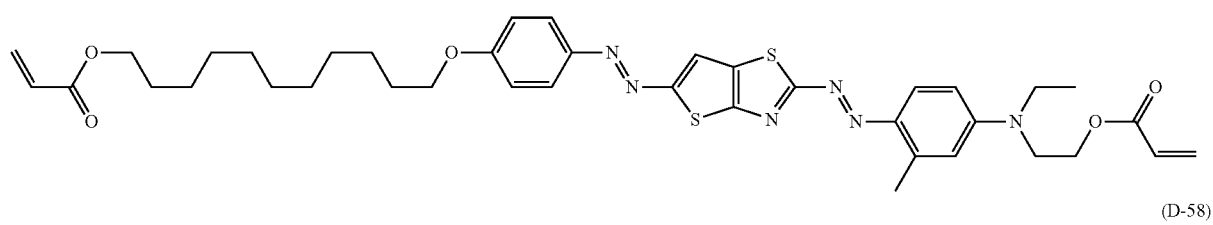

(D-57)

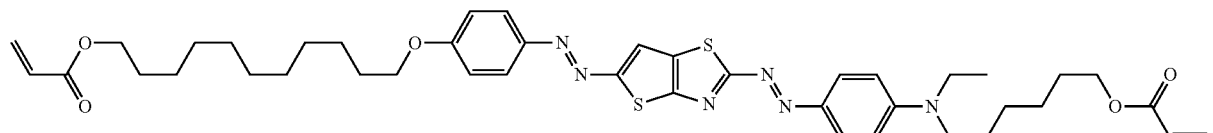

(D-58)

In the present invention, the light absorption anisotropic film is preferably a film formed using a liquid crystal composition containing a liquid crystalline compound together with the above-described dichroic substance since it is possible to align the dichroic substance with a higher alignment degree while suppressing the precipitation of the dichroic substance.

<Liquid Crystalline Compound>

As the liquid crystalline compound contained in the liquid crystal composition, any one of a low-molecular-weight liquid crystalline compound or a polymer liquid crystalline compound can be used.

Here, the "low-molecular-weight liquid crystalline compound" refers to a liquid crystalline compound having no repeating unit in the chemical structure.

The "polymer liquid crystalline compound" refers to a liquid crystalline compound having a repeating unit in the chemical structure.

Examples of the low-molecular-weight liquid crystalline compound include those described in JP2013-228706A.

Examples of the polymer liquid crystalline compound include the thermotropic liquid crystalline polymers described in JP2011-237513A. The polymer liquid crystalline compound may have a crosslinking group (for example, an acryloyl group and a methacryloyl group) at the terminal.

<Interface Improver>

The liquid crystal composition preferably contains an interface improver. Due to the interface improver contained, the smoothness of the coating surface is improved, and the alignment degree is improved or cissing and unevenness are suppressed. Thus, an improvement in the in-plane uniformity is anticipated.

As the interface improver, a material making the liquid crystalline compound horizontal on the coating surface side is preferable, and the compounds (horizontal alignment agents) described in paragraphs [0253] to [0293] of JP2011-237513A can be used.

In a case where the liquid crystal composition contains an interface improver, the content of the interface improver is preferably 0.001 to 5 parts by mass, and more preferably 0.01 to 3 parts by mass with respect to a total of 100 parts by mass of the dichroic substance and the liquid crystalline compound in the liquid crystal composition.

<Polymerization Initiator>

The liquid crystal composition may contain a polymerization initiator.

The polymerization initiator is not particularly limited, and a photosensitive compound, that is, a photopolymerization initiator is preferable.

As the photopolymerization initiator, various kinds of compounds can be used with no particular limitation. Examples of the photopolymerization initiator include α-carbonyl compounds (the specifications of U.S. Pat. Nos. 2,367,661A and 2,367,670A), acyloin ethers (the specification of U.S. Pat. No. 2,448,828A), aromatic acyloin compounds substituted by α-hydrocarbon (the specification of U.S. Pat. No. 2,722,512A), polynuclear quinone compounds (the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (the specifications of JP1985-105667A (JP-S60-105667A) and U.S. Pat. No. 4,239,850A), oxadiazole compounds (the specification of U.S. Pat. No. 4,212,970A), and acylphosphine oxide compounds (JP1988-40799B (JP-S63-40799B), JP1993-29234B (JP-H5-29234B), JP1998-95788B (JP-H10-95788B), and JP1998-29997B (JP-H10-29997B)).

A commercially available product can also be used as the photopolymerization initiator, and examples thereof include IRGACURE 184, IRGACURE 907, IRGACURE 369, IRGACURE 651, IRGACURE 819, and IRGACURE OXE-01 manufactured by BASF SE.

In a case where the liquid crystal composition of the present invention contains a polymerization initiator, the content of the polymerization initiator is preferably 0.01 to 30 parts by mass, and more preferably 0.1 to 15 parts by mass with respect to a total of 100 parts by mass of the dichroic substance and the liquid crystalline compound in the liquid crystal composition. In a case where the content of the polymerization initiator is 0.01 parts by mass or greater, the curability of the light absorption anisotropic film is improved, and in a case where the content of the polymerization initiator is 30 parts by mass or less, the alignment of the light absorption anisotropic film is improved.

<Solvent>

From the viewpoint of workability and the like, the liquid crystal composition preferably contains a solvent.

Examples of the solvent include organic solvents such as ketones (for example, acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, benzene, toluene, xylene, and trimethylbenzene), halogenated carbons (for example, dichloromethane, trichloromethane, dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethyl sulfoxide), amides (for example, dimethylformamide and dimethylacetamide), and heterocyclic compounds (for example, pyridine), and water. These solvents may be used alone or in combination of two or more kinds thereof.

Among these solvents, organic solvents are preferably used, and halogenated carbons or ketones are more preferably used.

In a case where the liquid crystal composition contains a solvent, the content of the solvent is preferably 80 to 99 mass %, more preferably 83 to 97 mass %, and even more preferably 85 to 95 mass % with respect to the total mass of the liquid crystal composition.

<Other Components>

The liquid crystal composition may further contain a dichroic substance other than the specific dichroic substance, or contain a plurality of the specific dichroic substances. In a case where a plurality of dichroic substances are contained, it is preferable that a dichroic substance having a crosslinking group which crosslinks with the specific dichroic substance is contained, and it is more preferable that a plurality of the specific dichroic substances are contained from the viewpoint of further curing of the liquid crystal composition.

<Forming Method>

The method of forming a light absorption anisotropic film using the above-described liquid crystal composition is not particularly limited, and examples thereof include a method including a step of forming a coating film by applying the liquid crystal composition to a transparent support (hereinafter, also referred to as "coating film forming step") and a step of aligning a liquid crystalline component contained in the coating film (hereinafter, also referred to as "alignment step") in this order.

In a case where the above-described dichroic substance has liquid crystallinity, the liquid crystalline component includes the dichroic substance having liquid crystallinity, as well as the above-described liquid crystalline compound.

(Coating Film Forming Step)

The coating film forming step is a step of forming a coating film by applying the liquid crystal composition to a transparent support.

By using a liquid crystal composition containing the above-described solvent, or a liquid material such as a molten liquid obtained by heating the liquid crystal composition, the liquid crystal composition is easily applied to the transparent support.

Examples of the method of applying the liquid crystal composition include known methods such as a roll coating method, a gravure printing method, a spin coating method, a wire bar coating method, an extrusion coating method, a direct gravure coating method, a reverse gravure coating method, a die-coating method, a spray method, and an ink jet method.

In this aspect, an example has been given in which the liquid crystal composition is applied to the transparent support, but the present invention is not limited thereto. For example, the liquid crystal composition may be applied to an alignment film provided on the transparent support. Details of the alignment film will be described later.

(Alignment Step)

The alignment step is a step of aligning a liquid crystalline component contained in the coating film. Thus, a light absorption anisotropic film is obtained.

The alignment step may have a drying treatment. Through the drying treatment, a component such as a solvent can be removed from the coating film. The drying treatment may be performed by a method of leaving the coating film for a predetermined time at room temperature (for example, natural drying), or a heating and/or air blowing method.

Here, the liquid crystalline component contained in the liquid crystal composition may be aligned by the above-described coating film forming step or drying treatment. For example, in an aspect in which the liquid crystal composition is prepared as a coating liquid containing a solvent, the coating film is dried to remove the solvent from the coating film, and thus a coating film having light absorption anisotropy (that is, light absorption anisotropic film) is obtained.

In a case where the drying treatment is performed at a temperature that is equal to or higher than a temperature of transition of the liquid crystalline component contained in the coating film to a liquid crystalline phase, a heating treatment to be described below may not be performed.

The temperature of transition of the liquid crystalline component contained in the coating film to a liquid crystalline phase is preferably 10° C. to 250° C., and more preferably 25° C. to 190° C. from the viewpoint of manufacturing suitability or the like. The transition temperature is preferably 10° C. or higher since a cooling treatment or the like for lowering the temperature to a temperature range in which the liquid crystalline phase appears is not required. In addition, the transition temperature is preferably 250° C. or lower since high temperatures are not required even in transition to an isotropic liquid state at a much higher temperature than the temperature range in which the liquid crystalline phase appears, and wasting of thermal energy and deformation and deterioration of the substrate can thus be reduced.

The alignment step preferably has a heating treatment. Accordingly, the liquid crystalline component contained in the coating film can be aligned, and thus the coating film after the heating treatment can be preferably used as a light absorption anisotropic film.

The heating treatment is preferably performed at 10° C. to 250° C., and more preferably at 25° C. to 190° C. in view of manufacturing suitability or the like. The heating time is preferably 1 to 300 seconds, and more preferably 1 to 60 seconds.

The alignment step may have a cooling treatment to be performed after the heating treatment. The cooling treatment is a treatment for cooling the coating film after the heating to about room temperature (20° C. to 25° C.). Accordingly, the alignment of the liquid crystalline component contained in the coating film can be fixed. The cooling means is not particularly limited, and the cooling can be performed by a known method.

By the above steps, a light absorption anisotropic film can be obtained.

In this aspect, examples of the method of aligning the liquid crystalline component contained in the coating film include the drying treatment and the heating treatment, but are not limited thereto, and the alignment can be performed by a known alignment treatment.

(Other Steps)

The manufacturing method of a light absorption anisotropic film may have a step of curing the light absorption anisotropic film (hereinafter, also referred to as "curing step") after the alignment step.

For example, the curing step is performed by heating and/or light irradiation (exposure) in a case where the light absorption anisotropic film has a crosslinking group (polymerizable group). Among these, light irradiation is preferably performed to conduct the curing step.

As the light source used for curing, various light sources can be used such as infrared rays, visible light, and ultraviolet rays, and ultraviolet rays are preferable. In the curing, ultraviolet rays may be applied while heating is performed. Otherwise, ultraviolet rays may be applied via a filter which transmits only a component with a specific wavelength.

In a case where the exposure is performed while heating is performed, the heating temperature during the exposure is preferably 25° C. to 140° C. although it depends on the temperature of transition of the liquid crystalline component contained in the light absorption anisotropic film to a liquid crystalline phase.

In addition, the exposure may be performed under a nitrogen atmosphere. In a case where the light absorption anisotropic film is cured by radical polymerization, inhibition of the polymerization by oxygen is reduced, and thus the exposure is preferably performed under a nitrogen atmosphere.

In the present invention, the thickness of the light absorption anisotropic film is not particularly limited. The thickness is preferably 0.1 to 5.0 µm, and more preferably 0.3 to 1.5 µm.

[Transparent Resin Layer]

The transparent resin layer of the laminate according to the embodiment of the present invention is a layer containing a polymer which has a hydrophilic group and does not have a glass transition temperature (Tg) in a temperature range of 95° C. or lower (hereinafter, also referred to as "specific polymer").

Here, the hydrophilic group is a monovalent or divalent group, and examples thereof include an amide group, a hydroxy group, a urethane group (urethane bond), a polyoxyalkylene group (for example, a polyoxyalkylene group in which a polyoxyethylene group, a polyoxypropylene group, an oxyethylene group, and an oxypropylene group are blocked-bonded or randomly bonded), an amino group, a carboxyl group, alkali metal salt of the carboxyl group, an alkoxy group, a carbamoyl group, a sulfonamide group, a sulfamoyl group, a sulfonic group, and alkali metal salt of the sulfonic group.

The presence and identification of the hydrophilic group of the specific polymer in the transparent resin layer can be detected by performing the measurement by total reflection infrared spectroscopy (ATR-IR) using a Fourier transform infrared spectral device (for example, Nicolet iS5 FT-IR, manufactured by Thermo Fisher Scientific Inc.) with a diamond crystal as a prism and incidence (single reflection) at 45 degrees.

The glass transition temperature (Tg) refers to an average of a temperature in which a measured temperature when the temperature is raised at a rate of temperature increase of 10° C./min using a differential scanning calorimeter (DSC) starts to change from the baseline and a temperature in which the measured temperature returns to the baseline. In the present invention, the transparent resin layer cut out from the laminate is used as an evaluation sample. Using a differential scanning calorimeter (DSC) Q2000 manufactured by TA Instruments, Inc., about 2 mg of the evaluation sample subjected to vacuum drying is weighed on an aluminum pan, the aluminum pan is set in a DSC measurement holder, and the glass transition temperature is obtained from an Inflection point when the temperature is raised from 10° C. to 300° C. at 2° C./min.

The main chain structure of the specific polymer is not particularly limited as long as the polymer does not have a glass transition temperature in a temperature range of 95° C. or lower, and examples thereof include polyacrylate, polymethacrylate, polyacrylamide, polystyrene, polyester, polyamide, polyimide, polyurethane, and polyurea.

In the present invention, the content of the specific polymer in the transparent resin layer is preferably 30 mass % or greater, more preferably 40 mass % or greater, and even more preferably 50 to 98 mass % with respect to the total mass of the total solid content of the transparent resin layer.

In the present invention, the specific polymer is preferably a polymer in which the ratio of the number of hydrophilic groups to the number of carbon atoms having a C—H bond is 0.05 to 0.45.

Here, regarding the ratio of the number of hydrophilic groups to the number of carbon atoms having a C—H bond, in a case where the molecular structure of a monomer (hydrophilic monomer to be described later) having a hydrophilic group for obtaining a specific polymer from a polymerization reaction can be identified, the ratio of the number of hydrophilic groups to the number of carbon atoms having a C—H bond in the molecular structure can be determined as it is. In a case where the monomer is unknown, an absorption spectrum with a horizontal axis indicating a wave number is obtained by total reflection infrared spectroscopy (ATR-IR) using a Fourier transform infrared spectral device (for example, Nicolet iS5 FT-IR, manufactured by Thermo Fisher Scientific Inc.), and then the ratio of the number of hydrophilic groups to the number of carbon atoms having a C—H bond can be calculated from a peak area derived from the hydrophilic group of the specific polymer and a peak area derived from the C—H bond.

In the present invention, the water contact angle of a surface of the transparent resin layer opposite to the light absorption anisotropic film is preferably 25° or greater and 60° or less, more preferably 25° or greater and 50° or less, and even more preferably 25° or greater and 40° or less since the high-temperature durability and the moisture-heat resistance of the laminate are improved.

Here, the water contact angle is obtained as follows: after humidity conditioning of the transparent resin layer for 2 hours or longer at 25° C. and a relative humidity of 60%, 1.7 µL of water is left on a surface of the measurement object held horizontally, and the water contact angle is obtained from an angle formed between the surface and the water droplet after 20 seconds. In the present invention, a surface contact angle measuring device (FACE CONTACT-ANGLE METER CA-A) manufactured by Kyowa Interface Science Co., Ltd. was used.

In the present invention, the thickness of the transparent resin layer is not particularly limited. The thickness is preferably 0.1 to 10 Gun, and more preferably 0.5 to 5 Gm.

[Alignment Film]

The laminate according to the embodiment of the present invention may have an alignment film between the transparent support and the light absorption anisotropic film described above.

Examples of the method of forming the alignment film include a rubbing treatment for a film surface using an organic compound (preferably a polymer), oblique deposition of an inorganic compound, formation of a layer having microgrooves, and accumulation of an organic compound (for example, ω-tricosanoic acid, dioctadecylmethylammonium chloride, and methyl stearylate) according to a Langmuir-Blodgett method (LB film). Furthermore, there have been known alignment films having an aligning function imparted thereto by applying an electrical field, applying a magnetic field, or light irradiation.

Among these, an alignment film formed by a rubbing treatment is preferable in view of easy control of a pretilt angle of the alignment film, and a photo-alignment film formed by light irradiation is also preferable in view of alignment uniformity.

<Rubbed Alignment Film>

The polymer material used for an alignment film formed by a rubbing treatment is described in many literatures, and many commercially available products are available. In the present invention, polyvinyl alcohol or polyimide, or derivatives thereof can be preferably used. Regarding the alignment film, the description in the 24th line on page 43 to 8th line on page 49 in WO2001/088574A1 can be referred to. The thickness of the alignment film is preferably 0.01 to 10 µm, and more preferably 0.01 to 1 µm.

<Photo-Alignment Film>

The photo-alignment compound used for an alignment film formed by light irradiation is described in many literatures. In the present invention, preferable examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignment units described in JP2002-265541A and JP2002-317013A, photocrosslinkable silane derivatives described in JP4205195B and JP4205198B, and photocrosslinkable polyimides, polyamides, and esters described in JP2003-520878A, JP2004-529220A, and JP4162850B. Azo compounds, photocrosslinkable polyimides, polyamides, and esters are more preferable.

Among these, a photosensitive compound having a photoreactive group which generates at least one of dimerization or isomerization by the action of light is preferably used as the photo-alignment compound.

In addition, the photoreactive group preferably has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

To a photo-alignment film formed from the above-described material, linearly polarized light or unpolarized light is applied to manufacture a photo-alignment film.

In this specification, the "linearly polarized light irradiation" and the "unpolarized light irradiation" are operations for causing a photoreaction to the photo-alignment material. The wavelength of the light used varies depending on the photo-alignment material used and is not particularly limited as long as the wavelength is a wavelength necessary for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon arc lamp, various lasers [for example, a semiconductor laser, a helium/neon laser, an argon ion laser, a helium/cadmium laser, and an YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction vertical or oblique to the alignment film surface is employed. Although the incidence angle of the light varies depending on the photo-alignment material, the incidence angle is preferably 0° to 90° (vertical), and preferably 40° to 90 .

In a case where unpolarized light is used, the alignment film is irradiated with unpolarized light from an oblique direction. The incidence angle of the light is preferably 10° to 80°, more preferably 20° to 60°, and even more preferably 30° to 50°.

The irradiation time is preferably 1 minute to 60 minutes, and more preferably 1 minute to 10 minutes.

In a case where patterning is required, a method of performing light irradiation using a photomask as many times as necessary for pattern formation, or a pattern writing method using laser beam scanning can be employed.

[Pressure Sensitive Layer]

The laminate according to the embodiment of the present invention may have a pressure sensitive layer on a side of the above-described transparent resin layer opposite to the light absorption anisotropic film from the viewpoint of bonding, to the side of the above-described transparent resin layer opposite to the light absorption anisotropic film, another functional layer (for example, a λ/4 plate to be described later).

Examples of the pressure sensitive adhesive contained in the pressure sensitive layer include rubber pressure sensitive adhesives, acrylic pressure sensitive adhesives, silicone pressure sensitive adhesives, urethane pressure sensitive adhesives, vinyl alkyl ether pressure sensitive adhesives, polyvinyl alcohol pressure sensitive adhesives, polyvinylpyrrolidone pressure sensitive adhesives, polyacrylamide pressure sensitive adhesives, and cellulose pressure sensitive adhesives.

Among these, acrylic pressure sensitive adhesives (pressure sensitive adhesives) are preferable from the viewpoints of transparency, weather fastness, heat resistance, and the like.

The pressure sensitive layer can be formed by, for example, a method in which a pressure sensitive adhesive solution is applied on a peeling sheet, dried, and then transferred to the surface of the transparent resin layer; a method in which a pressure sensitive adhesive solution is directly applied to the surface of the transparent resin layer and dried; or the like.

The pressure sensitive adhesive solution is prepared as, for example, a solution of about 10 to 40 mass % of a pressure sensitive adhesive dissolved or dispersed in a solvent such as toluene or ethyl acetate.

As an application method, a roll coating method such as reverse coating or gravure coating, a spin coating method, a screen coating method, a fountain coating method, a dipping method, a spray method, or the like can be employed.

Examples of the constituent material of the peeling sheet include thin leaf-like bodies such as a synthetic resin film such as polyethylene, polypropylene, and polyethylene terephthalate; a rubber sheet; paper; cloth; non-woven fabric; net; a foamed sheet; and metallic foil.

In the present invention, the thickness of the optional pressure sensitive layer is not particularly limited. The thickness is preferably 3 µm to 50 µm, more preferably 4 µm to 40 µm, and even more preferably 5 µm to 30 µm.

[λ/4 Plate]

The laminate according to the embodiment of the present invention may have λ/4 plate on a side of the above-described pressure sensitive layer opposite to the transparent resin layer.

Here, the "λ/4 plate" is a plate having a λ/4 function, and specifically, a plate having a function of converting linearly polarized light with a specific wavelength into circularly polarized light (or converting circularly polarized light into linearly polarized light).

Specific examples of the λ/4 plate include US2015/0277006A.

Specific examples of the aspect in which the λ/4 plate has a single layer structure include a retardation film in which an optically anisotropic layer having a λ/4 function is provided on a stretched polymer film or a support. Specific examples of the aspect in which the λ/4 plate has a multilayered structure include a broadband λ/4 plate having a laminate of a λ/4 plate and a λ/2 plate.

[Usage]

The laminate according to the embodiment of the present invention can be used as a polarizing element (polarizing plate). For example, it can be used as a linearly polarizing plate or a circularly polarizing plate.

In a case where the laminate according to the embodiment of the present invention has no optically anisotropic layer such as the λ/4 plate, the laminate can be used as a linearly polarizing plate. In a case where the laminate according to the embodiment of the present invention has the λ/4 plate, the laminate can be used as a circularly polarizing plate.

[Manufacturing Method of Laminate]

A manufacturing method of a laminate according to the embodiment of the present invention is a laminate manufacturing method of producing the above-described laminate according to the embodiment of the present invention.

The manufacturing method of the laminate according to the embodiment of the present invention has: a light absorption anisotropic film forming step of forming a light absorption anisotropic film using a liquid crystal composition containing the above-described dichroic substance (specific dichroic substance) represented by Formula (1) on the above-described transparent support; and a transparent resin layer forming step of forming, on the light absorption anisotropic film, a transparent resin layer containing a polymer which has a hydrophilic group and does not have a glass transition temperature in a temperature range of 95° C. or lower using a curable composition containing a polymerizable compound having a hydrophilic group.

[Light Absorption Anisotropic Film Forming Step]

The light absorption anisotropic film forming step is a step of forming a light absorption anisotropic film using a liquid crystal composition containing the above-described dichroic substance (specific dichroic substance) represented by Formula (1) on the above-described transparent support.

Here, the liquid crystal composition may contain a liquid crystalline compound, a surfactant, a polymerization initiator, a solvent, and other components as in the case of the liquid crystal composition described in the light absorption anisotropic film of the laminate according to the embodiment of the present invention.

Examples of the method of forming the light absorption anisotropic film using the liquid crystal composition include a method similar to the forming method described in the light absorption anisotropic film of the laminate according to the embodiment of the present invention, that is, a forming method having the above-described coating film forming step and alignment step.

[Transparent Resin Layer Forming Step]

The transparent resin layer forming step is a step of forming, on the above-described light absorption anisotropic film, a transparent resin layer of the laminate according to the embodiment of the present invention using a curable composition containing a polymerizable compound (hereinafter, also abbreviated as "hydrophilic monomer") having a hydrophilic group.

<Hydrophilic Monomer>

The hydrophilic monomer contained in the curable composition is not particularly limited as long as it is a compound having a hydrophilic group and a polymerizable group.

Here, examples of the hydrophilic group are similar to those exemplified in the above-described specific polymer.

Examples of the polymerizable group include an ethylenically unsaturated bond group, and specific examples thereof include an acryloyl group, a methacryloyl group, an epoxy group, an oxetanyl group, and a styryl group. An acryloyl group and a methacryloyl group are preferable.

In the present invention, the C log P value of the hydrophilic monomer is preferably less than 2.0, and more preferably 1.5 or less since the transparent resin layer to be obtained is less likely to permeate a hydrophobic substance.

Here, the C log P value is a value obtained by calculating a common logarithm log P of a 1-octanol-water partition coefficient P. Known methods and software can be used for calculating the C log P value. Unless otherwise specified, the C log P program incorporated in ChemBioDraw Ultra 13.0 of Cambridge Software Ltd is used in the present invention.

In the present invention, the hydrophilic monomer is preferably a compound in which the ratio of the number of hydrophilic groups to the number of carbon atoms having a C—H bond is 0.05 to 0.45.

Here, regarding the ratio of the number of hydrophilic groups to the number of carbon atoms having a C—H bond, in a case where the molecular structure of a target hydrophilic monomer can be identified, the ratio of the number of hydrophilic groups to the number of carbon atoms having a C—H bond in the molecular structure can be determined as it is. In a case where the target hydrophilic monomer is a mixture of a plurality of kinds of monomers, an absorption spectrum with a horizontal axis indicating a wave number is obtained by total reflection infrared spectroscopy (ATR-IR) using a Fourier transform infrared spectral device (for example, Nicolet iS5 FT-IR, manufactured by Thermo Fisher Scientific Inc.), and then the ratio of the number of hydrophilic groups to the number of carbon atoms having a C—H bond can be calculated from a peak area derived from the hydrophilic group of the mixture of the target hydrophilic monomers and a peak area derived from the C—H bond.

In the present invention, the higher the crosslinking density, the fewer voids in the cured film, and from the viewpoint that mass transfer can be suppressed, the ethylenically unsaturated bond group of the hydrophilic monomer is preferably bi- or higher-functional, and more preferably tri- or higher-functional per molecule. The ethylenically unsaturated bond group (C=C group) equivalent of the hydrophilic monomer is preferably less than 300, and more preferably 70 to 200.

Here, the C=C group equivalent refers to a value calculated from the molecular weight of the hydrophilic monomer with respect to the number of C=C groups.

Specific examples of the hydrophilic monomer include hydrophilic monomers HM-1 to HM-11 represented by the following formulae.

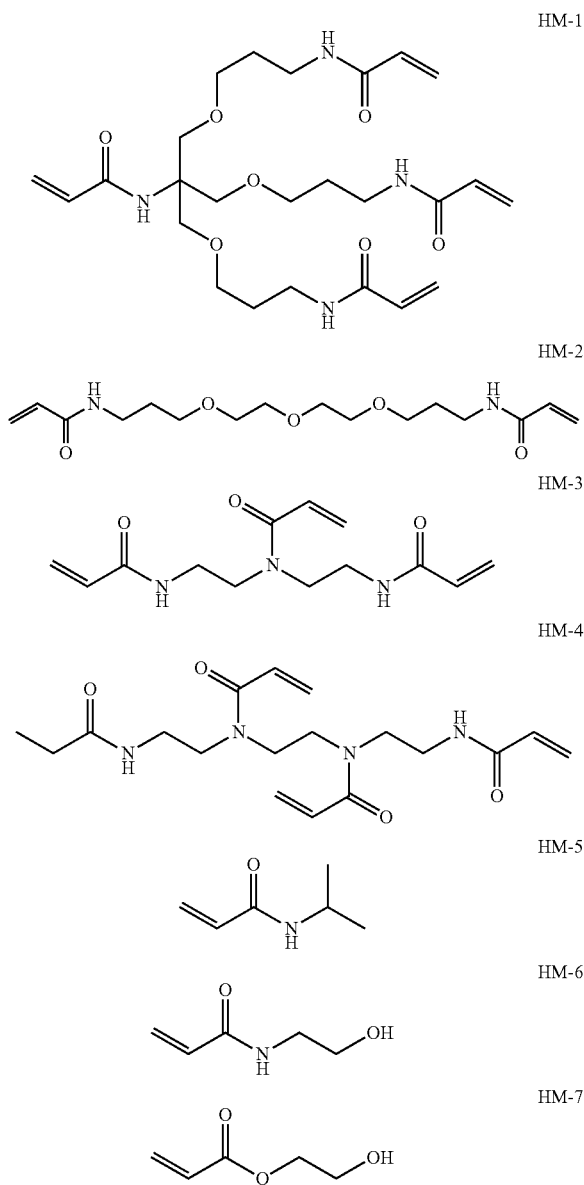

HM-8

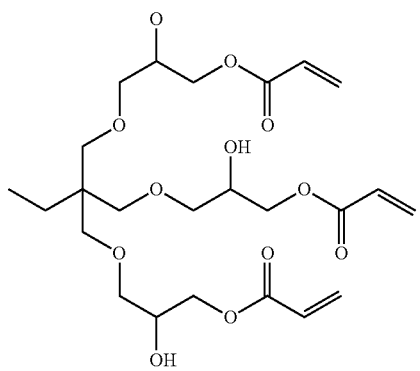

HM-9

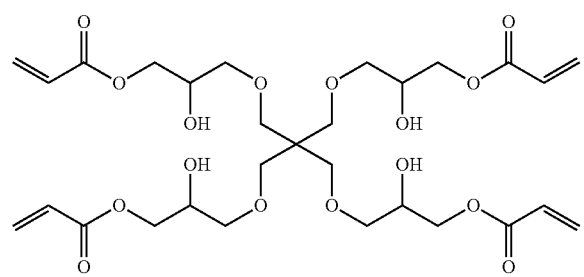

HM-10

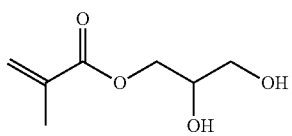

HM-11

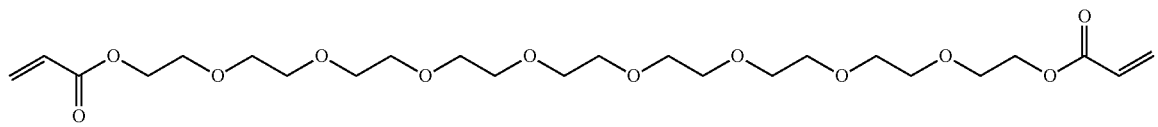

<Polymerization Initiator>

The curable composition preferably contains a polymerization initiator other than the hydrophilic monomer.

Examples of the polymerization initiator are similar to those described in the liquid crystal composition.

<Solvent>

From the viewpoint of workability and the like, the curable composition preferably contains a solvent other than the hydrophilic monomer.

Examples of the solvent are similar to those described in the liquid crystal composition.

Examples of the method of forming the transparent resin layer include a method in which the curable composition is applied to the above-described light absorption anisotropic film, dried, and then fixed by polymerization.

Here, the application method is not particularly limited, and examples thereof include a dip coating method, an air knife coating method, a curtain coating method, a roller coating method, a die coating method, a wire bar coating method, and a gravure coating method.

Here, the polymerization conditions are not particularly limited, and ultraviolet rays are preferably used in the polymerization by light irradiation. The irradiation dose is preferably 10 mJ/cm$^2$ to 50 J/cm$^2$, more preferably 20 mJ/cm$^2$ to 5 J/cm$^2$, even more preferably 30 mJ/cm$^2$ to 3 J/cm$^2$, and particularly preferably 50 to 1,000 mJ/cm$^2$. The polymerization may be performed under heating conditions in order to accelerate the polymerization reaction.

[Image Display Device]

An image display device according to the embodiment of the present invention has the above-described laminate according to the embodiment of the present invention.

The display element used for the image display device according to the embodiment of the present invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the embodiment of the present invention, a liquid crystal display device using a liquid crystal cell as a display element, or an organic EL display device using an organic EL display panel as a display element is preferable, and a liquid crystal display device is more preferable.

[Liquid Crystal Display Device]

A liquid crystal display device as an example of the image display device according to the embodiment of the present invention has the above-described laminate according to the embodiment of the present invention (including no λ/4 plate) and a liquid crystal cell.

In the present invention, among the laminates provided on both sides of the liquid crystal cell, the laminate of the present invention is preferably used as the front-side polarizing element. More preferably, the laminate of the present invention is used as the front-side and rear-side polarizing elements.

The liquid crystal cell of the liquid crystal display device will be described below in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode, but is not limited thereto.

In a TN mode liquid crystal cell, with no application of a voltage, rod-like liquid crystalline molecules (rod-like liquid crystalline compound) are substantially horizontally aligned, and twist-aligned by 60° to 120°. The TN mode liquid crystal cell is most frequently used as a color TFT liquid crystal display device, and is described in many literatures.

In a VA mode liquid crystal cell, rod-like liquid crystalline molecules are substantially vertically aligned with no application of a voltage. The VA mode liquid crystal cell includes (1) a narrowly-defined VA mode liquid crystal cell in which rod-like liquid crystalline molecules are substantially vertically aligned with no application of a voltage, and are substantially horizontally aligned with the application of a voltage (described in JP1990-176625A (JP-H2-176625A)), (2) a (multi-domain vertical alignment (MVA) mode) liquid crystal cell in which the VA mode is made into multi-domains in order to expand the viewing angle (described in SID97, Digest of tech. Papers (proceedings) 28 (1997) 845), (3) an (axially symmetric aligned microcell (n-ASM) mode) liquid crystal cell in which rod-like liquid crystalline molecules are substantially vertically aligned with no application of a voltage, and are twisted in multi-domains with the application of a voltage (described in the proceedings 58 and 59 of Japanese Liquid Crystal Conference (1998)), and (4) a SURVIVAL mode liquid crystal cell (announced at liquid crystal display (LCD) internal 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystalline molecules are substantially horizontally aligned with respect to a substrate, and the liquid crystalline molecules respond in a planar manner with the application of an electric field parallel to a substrate surface. The IPS mode displays a black image with no application of an electric field, and the absorption axes of a pair of upper and lower polarizing plates are perpendicular to each other. A method of improving the viewing angle by reducing light leakage caused in the display of a black image in an oblique direction using an optical compensation sheet is disclosed by JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

For example, a preferable aspect of an organic EL display device as an example of the image display device according to the embodiment of the present invention is that the device has the above-described laminate according to the embodiment of the present invention (including a pressure sensitive layer and a λ/4 plate) and an organic EL display panel in this order from the visual recognition side. In this case, in the laminate, a transparent support, an alignment film to be optionally provided, a light absorption anisotropic film, a transparent resin layer, a pressure sensitive layer, and a λ/4 plate are disposed in order from the visual recognition side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

EXAMPLES

Hereinafter, the present invention will be more specifically described based on examples. Materials, used amounts, ratios, treatment contents, treatment procedures, and the like shown in the following examples are able to be properly changed as long as the changes do not depart from the gist of the present invention. Therefore, the scope of the present invention will not be restrictively interpreted by the following examples.

Example 1

<Production of Transparent Support 1>

An alignment film coating liquid 9 having the following composition was continuously applied to a TAC base (TG40, manufactured by FUJIFILM Corporation) having a thickness of 40 μm using a wire bar #8. The applied liquid was dried for 2 minutes at 100° C., and thus a transparent support 1 in which a polyvinyl alcohol (PVA) alignment film having a thickness of 0.8 μm was formed on the TAC base was obtained.

The modified polyvinyl alcohol was added to the alignment film coating liquid such that the solid content concentration was 4 wt %.

| Composition of Alignment Film Coating Liquid 9 | |
|---|---|
| Following Modified Polyvinyl Alcohol | |
| Water | 70 parts by mass |
| Methanol | 30 parts by mass |

Modified Polyvinyl Alcohol (In the following formula, the numerical value assigned to the repeating unit represents the molar ratio of each repeating unit.)

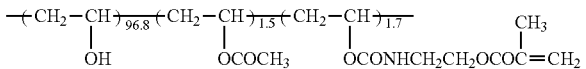

<Formation of Alignment Film 1>

41.6 parts by mass of butoxyethanol, 41.6 parts by mass of dipropylene glycol monomethyl, and 15.8 parts by mass of pure water were added to 1 part by mass of a photo-alignment material E-1 having the following structure, and the obtained solution was filtered under pressure with a 0.45 μm membrane filter to prepare a photo-alignment film coating liquid 1.

Next, the obtained photo-alignment film coating liquid 1 was applied to the transparent support 1, and dried for 1 minute at 60° C. Then, the obtained coating film was irradiated with linearly polarized ultraviolet rays (illuminance: 4.5 mW, irradiation dose: 500 mJ/cm$^2$) using a polarized ultraviolet exposure device to produce an alignment film 1.

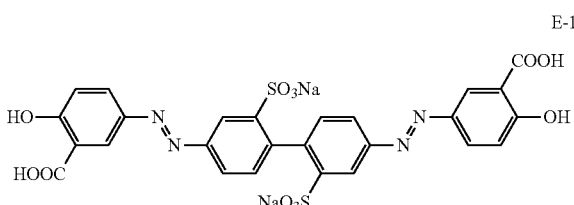

E-1

<Formation of Light Absorption Anisotropic Film 1>

The following light absorption anisotropic film forming composition 1 (abbreviated as "composition 1" in the following Table 1) was continuously applied to the obtained alignment film 1 using a wire bar #4, and a coating film 1 was formed.

Next, the coating film 1 was heated for 90 seconds at 140° C., and the coating film 1 was cooled to room temperature (23° C.).

Next, the coating film was heated for 60 seconds at 80° C., and cooled again to room temperature.

Then, irradiation was performed under an irradiation condition of an illuminance of 28 mW/cm$^2$ for 60 seconds using a high-pressure mercury lamp to produce a light absorption anisotropic film 1 on the alignment film 1.

| Composition of Light Absorption Anisotropic Film Forming Composition 1 | |
|---|---|
| Following Yellow Azo Dye Y-1 | 7.1 parts by mass |
| Following Cyan Azo Dye D-55 | 9.1 parts by mass |
| Following Polymer Liquid Crystal Compound P-1 | 101.1 parts by mass |
| Polymerization Initiator IRGACURE 819 (manufactured by BASF SE) | 1.0 part by mass |
| Following Interface Improver F-1 | 0.3 parts by mass |
| Cyclopentanone | 617.0 parts by mass |
| Tetrahydrofuran | 264.4 parts by mass |

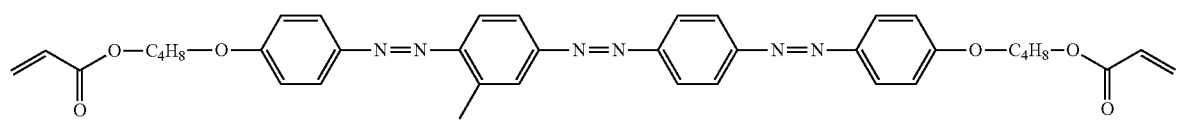

Yellow Azo Dye Y-1 (Y-1)

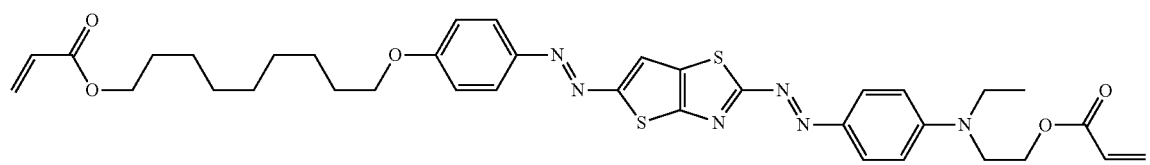

Cyan Azo Dye D-55 (D-55)

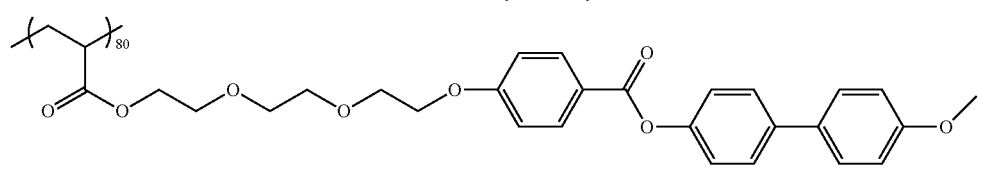

Polymer Liquid Crystal Compound P-1

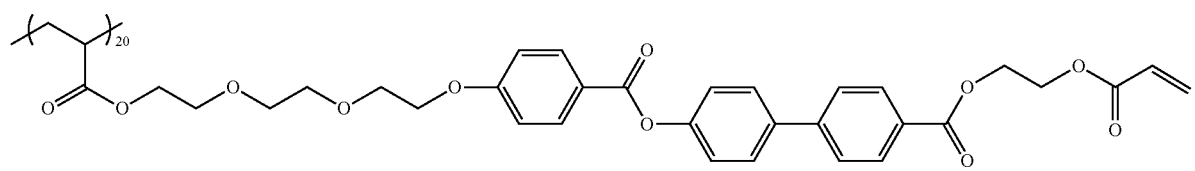

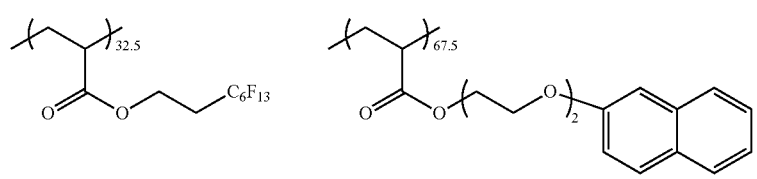

Interface Improver F-1

<Formation of Transparent Resin Layer 1>

The following curable composition 1 was continuously applied to the light absorption anisotropic film 1 of Example 1 using a wire bar #2, and dried for 5 minutes at 60° C.

Then, irradiation was performed under an irradiation condition of an illuminance of 28 mW/cm² for 60 seconds using a high-pressure mercury lamp, and the resin composition was cured. Accordingly, a laminate in which a transparent resin layer 1 was formed on the light absorption anisotropic film 1 was produced.

A cross-section of the transparent resin layer 1 was cut using a microtome cutting machine, and a film thickness was measured with a scanning electron microscope (SEM). The film thickness was about 1.2 μm.

| Curable Composition 1 | |
| --- | --- |
| Following Hydrophilic Monomer HM-1 | 29 parts by mass |
| Polymerization Initiator IRGACURE 819 (manufactured by BASF SE) | 1 part by mass |
| Ethanol | 70 parts by mass |

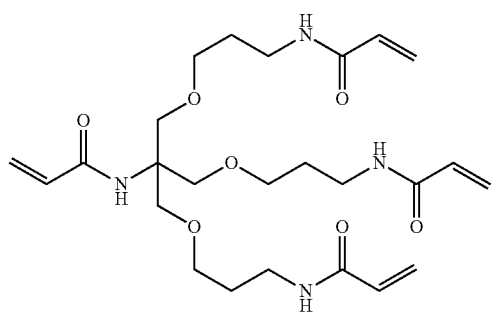

Hydrophilic Monomer HM-1

Example 2

<Formation of Alignment Film 2>
(Synthesis of Polymer E-2)

A reaction container comprising a stirrer, a thermometer, a dropping funnel, and a reflux cooling pipe was charged with 100.0 parts by mass of 2-(3,4-epoxycyclohexyl)ethyltrimethoxysilane, 500 parts by mass of methyl isobutyl ketone, and 10.0 parts by mass of triethylamine, and the mixture was stirred at room temperature. Next, 100 parts by mass of deionized water was added dropwise to the obtained mixture from the dropping funnel for 30 minutes. Then, a reaction was caused for 6 hours at 80° C. during mixing of the mixture under reflux. After the reaction was terminated, the organic phase was taken out and washed with a 0.2 mass % aqueous ammonium nitrate solution until the water after washing became neutral. Thereafter, from the obtained organic phase, the solvent and the water were distilled off under reduced pressure to obtain an epoxy group-containing polyorganosiloxane as a viscous transparent liquid.

¹H-NMR (Nuclear Magnetic Resonance) analysis was performed on the epoxy group-containing polyorganosiloxane, and it was confirmed that a peak based on an oxiranyl group was obtained in accordance with a theoretical intensity in the vicinity of a chemical shift (δ)=3.2 ppm, and a side reaction of the epoxy group did not occur during the reaction. A weight-average molecular weight Mw of the epoxy group-containing polyorganosiloxane was 2,200, and the epoxy equivalent was 186 g/mol.

Next, 100 mL of a three-neck flask was charged with 10.1 parts by mass of the epoxy group-containing polyorganosiloxane obtained as described above, 0.5 parts by mass of an acrylic group-containing carboxylic acid (TOAGOSEI CO., LTD., trade name "ARONIX M-5300", ω-carboxy polycaprolactone acrylate (polymerization degree n≈2)), 20 parts by mass of butyl acetate, 1.5 parts by mass of a cinnamic acid derivative obtained by the method of Synthesis Example 1 in JP2015-026050A, and 0.3 parts by mass of tetrabutylammonium bromide, and the obtained mixture was stirred for 12 hours at 90° C. After the stirring, the obtained mixture was diluted with the same amount (mass) of butyl acetate, and the diluted mixture was water-washed 3 times. Concentration of the obtained mixture and dilution with butyl acetate were repeated 2 times, and finally, a solution containing a polyorganosiloxane (the following polymer E-2) having a photo-aligned group was obtained. A weight-average molecular weight Mw of the polymer E-2 was 9,000. In addition, as a result of ¹H-NMR analysis, a component having a cinnamate group in the polymer E-2 was 23.7 mass %.

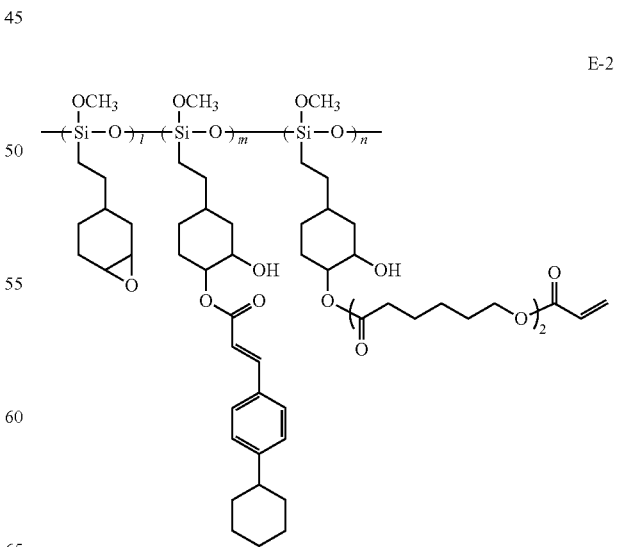

E-2

(Preparation of Alignment Film Forming Composition 2)

An alignment film forming composition 2 was prepared by mixing the following components.

| | |
|---|---|
| Above Polymer E-2 | 10.67 parts by mass |
| Following Low-Molecular-Weight Compound R-1 | 5.17 parts by mass |
| Following Additive (B-1) | 0.53 parts by mass |
| Butyl Acetate | 8287.37 parts by mass |
| Propylene Glycol Monomethyl Ether Acetate | 2071.85 parts by mass |

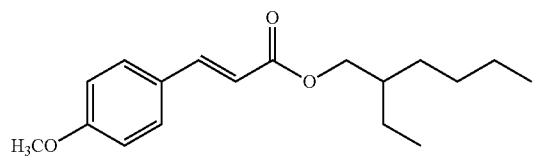 [SMILES: CCCCC(CC)COC(=O)/C=C/c1ccc(OC)cc1]

Low-Molecular-Weight Compound R-1

Additive (B-1): TA-60B (see the structural formula below) manufactured by San-Apro Ltd.

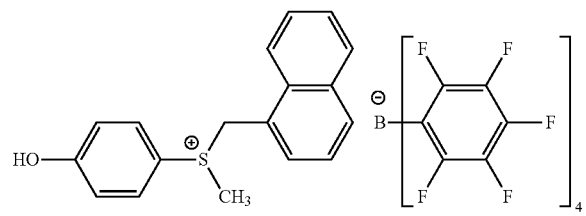

By a spin coating method, the alignment film forming composition 2 was applied to a PET support, the support coated with the alignment film forming composition 2 was dried for 5 minutes on a hot plate at 80° C. to remove the solvent, and a coating film was formed.

The obtained coating film was irradiated with polarized ultraviolet rays (25 mJ/cm², ultra-high-pressure mercury lamp), and thus an alignment film 2 was produced.

A laminate of Example 2 was produced in the same manner as in Example 1, except that the alignment film 2 was used instead of the alignment film 1.

Example 3

<Formation of Alignment Film 3>

An alignment film forming composition 3 was applied to a dried PET support using a bar #4. The applied alignment film forming composition 3 was dried for 15 minutes at 80° C., and then heated for 1 hour at 250° C. Accordingly, a coating film was formed on the PET support.

The obtained coating film was irradiated once with polarized ultraviolet rays (1 J/cm², ultra-high-pressure mercury lamp), and thus an alignment film 3 was produced on the PET support.

| Composition of Alignment film Forming Composition 3 | |
|---|---|
| Polyimide Alignment Film Material (SE-130, manufactured by Nissan Chemical Corporation) | 2.0 parts by mass |
| N-Methylpyrrolidone | 98.0 parts by mass |

A laminate of Example 3 was produced in the same manner as in Example 1, except that the alignment film 3 was used instead of the alignment film 1.

Example 4

<Synthesis of Liquid Crystalline Compound>

A liquid crystalline compound (1-6) represented by Formula (1-6) was synthesized by the method described in Lub et al. Recl. Trav. Chim. Pays-Bas, 115, 321 to 328 (1996).

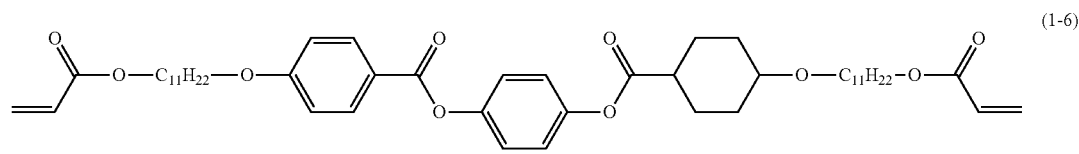

(1-6)

Next, a liquid crystalline compound (1-7) represented by Formula (1-7) was synthesized with reference to the synthesis method of the compound (1-6).

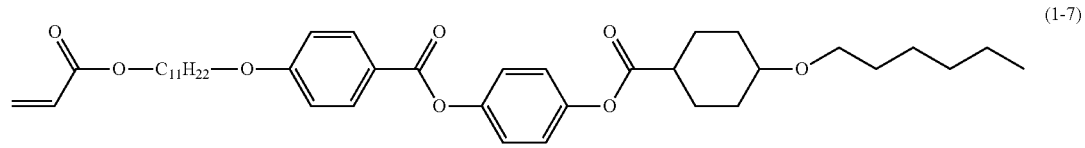

(1-7)

<Preparation of Light Absorption Anisotropic Film Forming Composition 2>

A light absorption anisotropic film forming composition 2 (abbreviated as "composition 2" in the following Table 1) was prepared by mixing and stirring the following components for 1 hour at 80° C.

| Composition of Light Absorption Anisotropic Film Forming Composition 2 | |
|---|---|
| Liquid Crystalline Compound (1-6) | 50 parts by mass |
| Liquid Crystalline Compound (1-7) | 50 parts by mass |
| Azo Dye (NKX2029; manufactured by Hayashibara Co., Ltd.) | 2.5 parts by mass |
| Polymerization Initiator IRGACURE 369 (manufactured by BASF SE) | 6 parts by mass |
| Polyacrylate Compound (BYK-361N; manufactured by BYK-Chemie GmbH) | 1.2 parts by mass |
| Cyclopentanone | 250 parts by mass |

A laminate of Example 4 was produced in the same manner as in Example 1, except that the light absorption anisotropic film forming composition 2 was used instead of the light absorption anisotropic film forming composition 1, and the following forming method was used.

<Forming Method>

The light absorption anisotropic film forming composition 2 was applied on the alignment film 1 by a spin coating method such that a film thickness was 0.7 μm. Then, after heating and drying for 3 minutes on a hot plate at 120° C., the film was quickly cooled to 70° C. or lower. Then, irradiation was performed thereon with an exposure dose of 2,400 mJ/cm$^2$ (365 nm) using an ultraviolet irradiation device to cure the film.

Example 5

A laminate of Example 5 was produced in the same manner as in Example 1, except that a light absorption anisotropic film forming composition 3 (abbreviated as "composition 3" in the following Table 1) was used instead of the light absorption anisotropic film forming composition 1.

| Composition of Light Absorption Anisotropic Film Forming Composition 3 | |
|---|---|
| Following Cyan Azo Dye D-55 | 16.2 parts by mass |
| Above Polymer Liquid Crystal Compound P-1 | 101.1 parts by mass |
| Polymerization Initiator IRGACURE 819 (manufactured by BASF SE) | 1.0 part by mass |
| Above Interface Improver F-1 | 0.3 parts by mass |
| Cyclopentanone | 617.0 parts by mass |
| Tetrahydrofuran | 264.4 parts by mass |

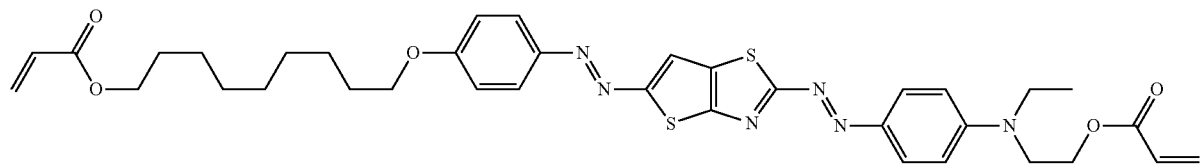

(D-55)

Cyan Azo Dye D-55

Example 6

A laminate of Example 6 was produced in the same manner as in Example 1, except that a light absorption anisotropic film forming composition 4 (abbreviated as "composition 4" in the following Table 1) was used instead of the light absorption anisotropic film forming composition 1.

| Composition of Light Absorption Anisotropic Film Forming Composition 4 | |
|---|---|
| Following Yellow Azo Dye Y-2 | 7.1 parts by mass |
| Following Cyan Azo Dye D-56 | 9.1 parts by mass |
| Above Polymer Liquid Crystal Compound P-1 | 101.1 parts by mass |
| Polymerization Initiator IRGACURE 819 (manufactured by BASF SE) | 1.0 part by mass |
| Above Interface Improver F-1 | 0.3 parts by mass |
| Cyclopentanone | 617.0 parts by mass |
| Tetrahydrofuran | 264.4 parts by mass |

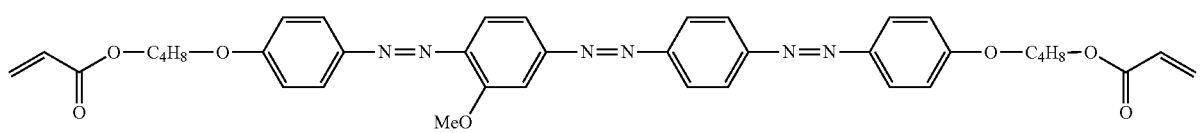

Yellow Azo Dye Y-2 (Y-2)

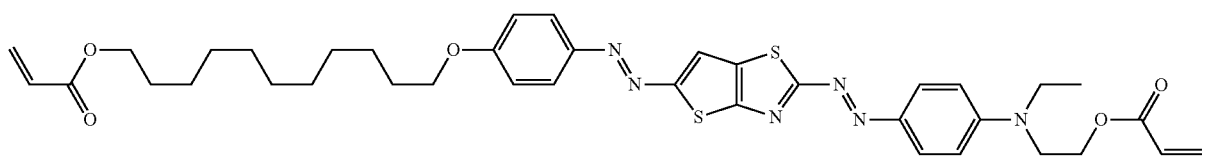

Cyan Azo Dye D-56 (D-56)

Examples 7 to 14 and 17 to 19 and Comparative Examples 4 and 5

Laminates were produced in the same manner as in Example 1, except that hydrophilic monomers of the kinds shown in the following Table 1 were used instead of the hydrophilic polymer HM-1 in the curable composition 1 forming the transparent resin layer.

The structural formulae of hydrophilic polymers HM-2 to HM-11 shown in the following Table 1 are as described above, and the structural formulae of DPHA and A-DCP are as shown below.

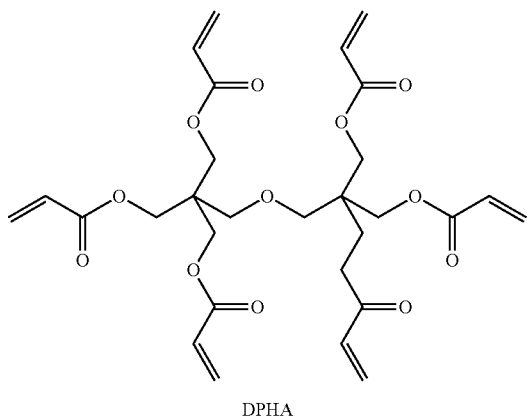

DPHA

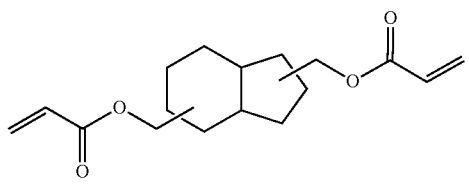

A-DCP

Examples 15 and 16

Laminates were produced in the same manner as in Example 1, except that the thicknesses of the transparent resin layers were as shown in the following Table 1.

Comparative Example 1

A laminate of Comparative Example 1 was produced in the same manner as in Example 1, except that the transparent resin layer was not provided.

Comparative Example 2

A laminate of Comparative Example 2 was produced in the same manner as in Example 1, except that a light absorption anisotropic film forming composition 5 (abbreviated as "composition 5" in the following Table 1) was used instead of the light absorption anisotropic film forming composition 1.

| Composition of Light Absorption Anisotropic Film Forming Composition 5 | |
|---|---|
| Following Yellow Dye A | 7.1 parts by mass |
| Following Cyan Dye D | 9.1 parts by mass |
| Above Polymer Liquid Crystal Compound P-1 | 101.1 parts by mass |
| Polymerization Initiator IRGACURE 819 (manufactured by BASF SE) | 1.0 part by mass |
| Above Interface Improver F-1 | 0.3 parts by mass |
| Cyclopentanone | 617.0 parts by mass |
| Tetrahydrofuran | 264.4 parts by mass |

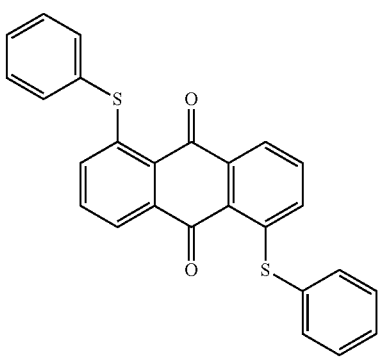

Yellow Dye A

Cyan Dye D

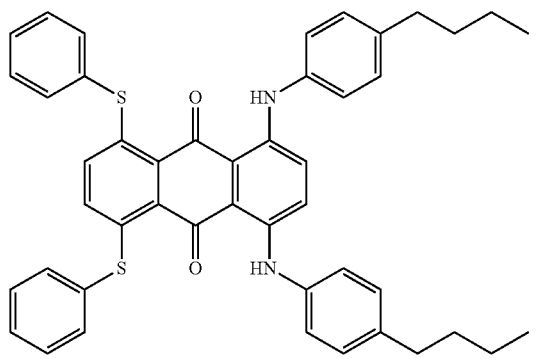

Comparative Example 3

A laminate of Comparative Example 3 was produced in the same manner as in Example 1, except that the following curable composition 2 was used instead of the curable composition 1.

| Curable Composition 2 | |
| --- | --- |
| Following Modified Polyvinyl Alcohol (PVA) | 7 parts by mass |
| Water | 72 parts by mass |
| Methanol | 21 parts by mass |

Modified Polyvinyl Alcohol (PVA)

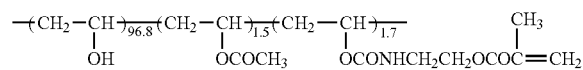

The C log P value and the C═C group equivalent of the polymerizable compound (hydrophilic monomer) used for forming the transparent resin layer of each of Examples 1 to 20 and Comparative Examples 1 to 5, the hydrophilic group of the specific polymer contained in the transparent resin layer, the presence or absence of the glass transition temperature (Tg) (temperature in a case where Tg existed) in a temperature range of 95° C. or lower, and the water contact angle of a surface of the transparent resin layer were measured by the above-described methods, respectively. The results thereof are shown in the following Table 1.

Regarding the C log P value of Comparative Example 3, the hydrophilic group of PVA is a calculated value of the following structure (abbreviated as "vinyl OH" in the following Table 1).

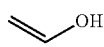

<Alignment Degree>

In a state in which a linear polarizer was inserted on the light source side of an optical microscope (manufactured by Nikon Corporation, product name "ECLIPSE E600 POL"), the light absorption anisotropic film of each of the examples and the comparative examples was set on a sample table, and using a multi-channel spectroscope (manufactured by Ocean Optics, Inc., product name "QE65000"), an absorbance of the light absorption anisotropic film in a wavelength region of 400 to 700 nm was measured to calculate an alignment degree by the following formula. The results are shown in the following Table 1.

Alignment Degree: $S=[(Az0/Ay0)-1]/[(Az0/Ay0)+2]$

Az0: absorbance of light absorption anisotropic film with respect to polarization in absorption axis direction Ay0: absorbance of light absorption anisotropic film with respect to polarization in polarization axis direction <High-Temperature Durability>

A pressure sensitive layer was formed on the transparent hard resin layer (light absorption anisotropic film in Comparative Example 1) in the produced laminate, and subjected to a durability test for 500 hours at 80° C. (dry) while being bonded to glass. The transmittances before and after the durability test were measured and evaluated based on the following criteria. The results are shown in the following Table 1.

A: The change in transmittance is less than 1%.

B: The change in transmittance is 1% or greater and less than 3%.

C: The change in transmittance is 3% or greater and less than 5%.

D: The change in transmittance is 3% or greater and less than 15%.

E: The change in transmittance is 15% or greater.

<Moisture-Heat Resistance>

A pressure sensitive layer was formed on the transparent hard resin layer (light absorption anisotropic film in Comparative Example 1) in the produced laminate, and subjected to a durability test for 500 hours at 60° C. and a relative humidity of 90% while being bonded to glass. The transmittances before and after the durability test were measured and evaluated based on the following criteria. The results are shown in the following Table 1.

A: The change in transmittance is less than 1%.

B: The change in transmittance is 1% or greater and less than 3%.

C: The change in transmittance is 3% or greater and less than 5%.

D: The change in transmittance is 3% or greater and less than 15%.

E: The change in transmittance is 15% or greater.

TABLE 1

| | | | | Transparent Resin Layer | | | | |
| --- | --- | --- | --- | --- | --- | --- | --- | --- |
| | | | | Hydrophilic Monomer | | | | |
| | Layer Configuration | Alignment Film | Light Absorption Anisotropic Film | Kind | ClogP | C=C Group Equivalent | Number of Hydrophilic Groups per Molecule | Specific Monomer Hydrophilic Groups |
| Example 1 | Configuration 1 | Azo (E-1) | Configuration 1 | HM-1 | −0.19 | 127 | 4 | Amide Group |
| Example 2 | Configuration 1 | Cinnamoyl (E-2) | Configuration 1 | HM-1 | −0.19 | 127 | 4 | Amide Group |
| Example 3 | Configuration 1 | Polyimide | Configuration 1 | HM-1 | −0.19 | 127 | 4 | Amide Group |
| Example 4 | Configuration 1 | Azo (E-1) | Configuration 2 | HM-1 | −0.19 | 127 | 4 | Amide Group |
| Example 5 | Configuration 1 | Azo (E-1) | Configuration 3 | HM-1 | −0.19 | 127 | 4 | Amide Group |
| Example 6 | Configuration 1 | Azo (E-1) | Configuration 4 | HM-1 | −0.19 | 127 | 4 | Amide Group |
| Example 7 | Configuration 1 | Azo (E-1) | Configuration 1 | HM-2 | −0.32 | 164 | 2 | Amide Group |
| Example 8 | Configuration 1 | Azo (E-1) | Configuration 1 | HM-3 | −0.19 | 88 | 3 | Amide Group |
| Example 9 | Configuration 1 | Azo (E-1) | Configuration 1 | HM-4 | 0.30 | 91 | 4 | Amide Group |
| Example 10 | Configuration 1 | Azo (E-1) | Configuration 1 | HM-5 | 1.06 | 113 | 1 | Amide Group |
| Example 11 | Configuration 1 | Azo (E-1) | Configuration 1 | HM-6 | −0.38 | 115 | 1 | Amide Group |
| Example 12 | Configuration 1 | Azo (E-1) | Configuration 1 | HM-8 | −0.78 | 173 | 3 | Hydroxyl Group |
| Example 13 | Configuration 1 | Azo (E-1) | Configuration 1 | HM-9 | −2.77 | 162 | 4 | Hydroxyl Group |
| Example 14 | Configuration 1 | Azo (E-1) | Configuration 1 | HM-10/HM-4 [90/10]*1 | 0.24 | 160 | 2 | Hydroxyl Group |
| Example 15 | Configuration 1 | Azo (E-1) | Configuration 1 | HM-1 | −0.19 | 127 | 4 | Amide Group |
| Example 16 | Configuration 1 | Azo (E-1) | Configuration 1 | HM-1 | −0.19 | 127 | 4 | Amide Group |
| Example 17 | Configuration 1 | Azo (E-1) | Configuration 1 | HM-11 | 0.19 | 261 | 1 | PEO Chain |
| Example 18 | Configuration 1 | Azo (E-1) | Configuration 1 | HM-1/A-DCP [50/50]*1 | −0.19 | 127 | 4 | Amide Group |
| Example 19 | Configuration 1 | Azo (E-1) | Configuration 1 | HM-1/A-DCP [75/25]*1 | −0.19 | 127 | 4 | Amide Group |
| Comparative Example 1 | Configuration 3 | Azo (E-1) | Configuration 1 | None | — | — | — | None |
| Comparative Example 2 | Configuration 1 | Azo (E-1) | Configuration 5 | HM-1 | −0.32 | 164 | 4 | Amide Group |
| Comparative Example 3 | Configuration 1 | Azo (E-1) | Configuration 1 | PVA | 0.52*2 | — | — | Vinyl OH |
| Comparative Example 4 | Configuration 1 | Azo (E-1) | Configuration 1 | DPHA | 2.94 | 87 | 0 | None |
| Comparative Example 5 | Configuration 1 | Azo (E-1) | Configuration 1 | A-DCP | 4.69 | 152 | 0 | None |

| | Transparent Resin Layer | | | | | | |
| --- | --- | --- | --- | --- | --- | --- | --- |
| | Specific Monomer | | | | | | |
| | Number of Hydrophilic Groups/Number of Carbon Atoms Having C—H Bonds | Tg | Reaction Rate | Water Contact Angle (degrees) | Thickness (μm) | Alignment Degree | High-Temperature Durability | Moisture-Heat Resistance |
| Example 1 | None | 0.20 | 60% | 28 | 1.2 | 0.95 | A | A |
| Example 2 | None | 0.20 | 60% | 28 | 1.2 | 0.94 | A | A |
| Example 3 | None | 0.20 | 60% | 28 | 1.2 | 0.94 | A | A |

TABLE 1-continued

| | | | | | | | | |
|---|---|---|---|---|---|---|---|---|
| Example 4 | None | 0.20 | 60% | 28 | 1.2 | 0.91 | A | A |
| Example 5 | None | 0.20 | 60% | 28 | 1.2 | 0.92 | A | A |
| Example 6 | None | 0.20 | 60% | 28 | 1.2 | 0.92 | A | A |
| Example 7 | None | 0.14 | 60% | 34 | 1.2 | 0.95 | B | A |
| Example 8 | None | 0.30 | 45% | 32 | 1.2 | 0.95 | A | A |
| Example 9 | None | 0.31 | 65% | 48 | 1.2 | 0.94 | A | A |
| Example 10 | 134° C. | 0.20 | 40% | 38 | 1.2 | 0.93 | A | A |
| Example 11 | 98° C. | 0.25 | 40% | 48 | 1.2 | 0.95 | A | A |
| Example 12 | None | 0.15 | 80% | 57 | 1.2 | 0.95 | B | B |
| Example 13 | None | 0.17 | 70% | 48 | 1.2 | 0.95 | B | B |
| Example 14 | None | 0.34 | 40% | 36 | 1.2 | 0.94 | B | B |
| Example 15 | None | 0.20 | 60% | 28 | 0.1 | 0.95 | A | C |
| Example 16 | None | 0.20 | 60% | 28 | 10 | 0.95 | C | A |
| Example 17 | None | 0.20 | 30% | 39 | 1.2 | 0.92 | C | C |
| Example 18 | None | 0.22 | 60% | 50 | 1.2 | 0.92 | A | B |
| Example 19 | None | 0.21 | 60% | 39 | 1.2 | 0.93 | A | A |
| Comparative Example 1 | None | — | — | — | — | 0.95 | E | E |
| Comparative Example 2 | None | 0.20 | 60% | 28 | 1.2 | 0.87 | A | A |
| Comparative Example 3 | 85° C. | 0.50 | — | 38 | 1.2 | 0.89 | D | B |
| Comparative Example 4 | — | — | 60% | 62 | 1.2 | 0.9 | D | D |
| Comparative Example 5 | — | — | 70% | 71 | 1.2 | 0.88 | D | D |

*1: Those in brackets represents a quantitative ratio
*2: A calculated value of the hydrophilic group of PVA From the results shown in Table 1, it was found that in the laminate provided with, together with a light absorption anisotropic film containing a dichroic substance represented by Formula (1), a transparent resin layer containing a polymer which has a hydrophilic group and does not have a glass transition temperature in a temperature range of 95° C. or lower, an excellent alignment property of the dichroic substance is maintained, and both high-temperature durability and moisture-heat resistance are excellent (Examples 1 to 19).

Example 20

[Production of λ/4 Retardation Film 1]

<Preparation of Photo-Alignment Film Composition>

A composition similar to the alignment film forming composition 2 used for forming the alignment film 2 used in Example 2 was prepared.

<Preparation of Optically Anisotropic Layer Coating Liquid>

An optically anisotropic layer coating liquid having the following composition was prepared.

| Optically Anisotropic Layer Coating Liquid | |
|---|---|
| Following Liquid Crystalline Compound L-3 | 42.00 parts by mass |
| Following Liquid Crystalline Compound L-4 | 42.00 parts by mass |
| Following Polymerizable Compound A-1 | 16.00 parts by mass |
| Following Low-Molecular-Weight Compound B-2 | 6.00 parts by mass |
| Following Polymerization Initiator S-1 (oxime type) | 0.50 parts by mass |
| Following Leveling Agent G-1 | 0.20 parts by mass |
| HISOLVE MTEM (manufactured by TOHO Chemical Industry Co., Ltd.) | 2.00 parts by mass |
| NK ESTER A-200 (manufactured by Shin-Nakamura Chemical Co., Ltd) | 1.00 part by mass |
| Methyl Ethyl Ketone | 424.8 parts by mass |

The group adjacent to the acryloyloxy group of the following liquid crystalline compounds L-3 and L-4 represents a propylene group (a group in which a methyl group is substituted by an ethylene group), and each of the following liquid crystalline compounds L-3 and L-4 represents a mixture of position isomers with different methyl group positions.

L-3

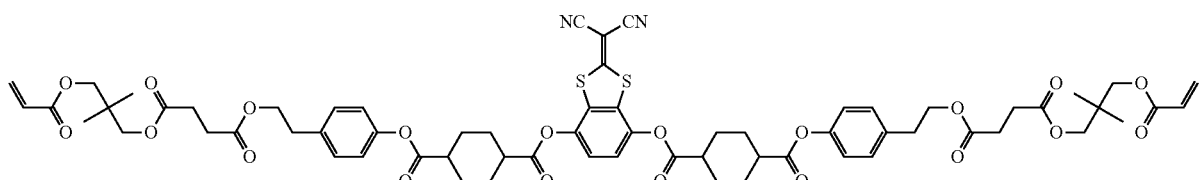

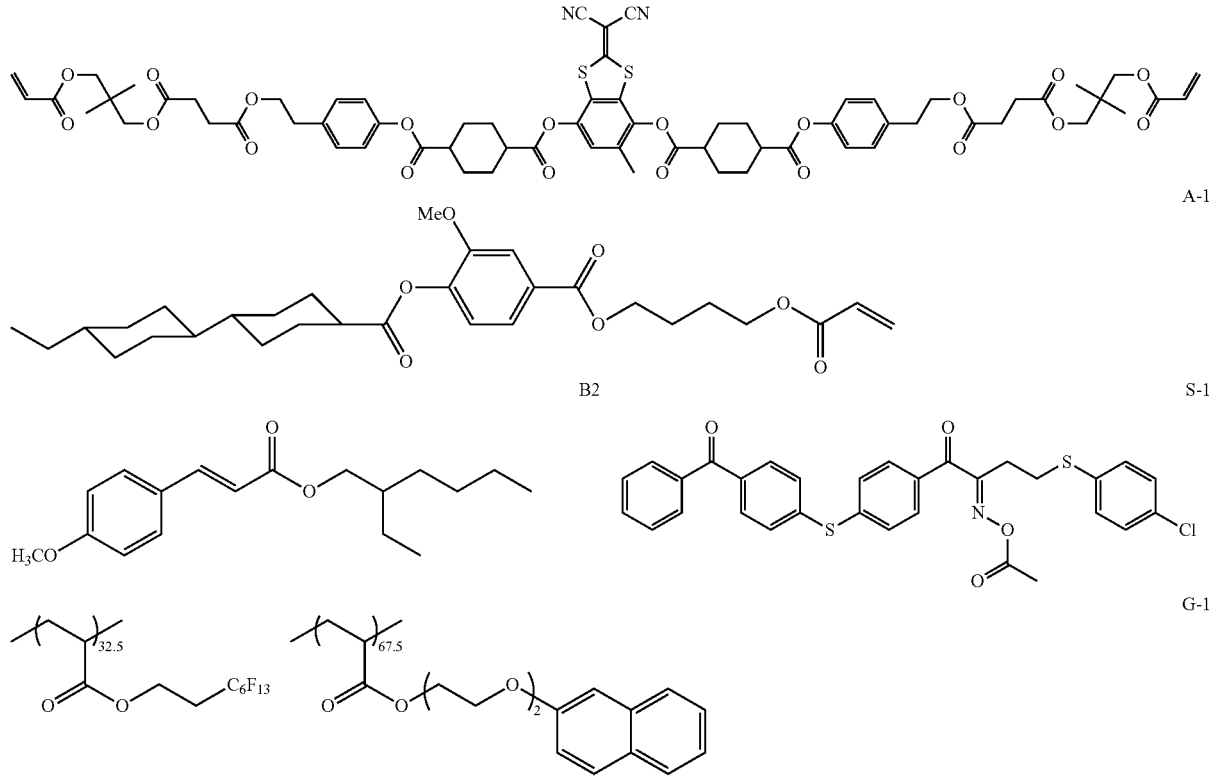

[Production of Cellulose Acylate Film 1]

(Production of Core Layer Cellulose Acylate Dope)

The following composition was put into a mixing tank and stirred to dissolve components, and a cellulose acetate solution to be used as a core layer cellulose acylate dope was prepared.

| Core Layer Cellulose Acylate Dope | |
|---|---|
| Cellulose Acetate Having Acetyl Substitution Degree of 2.88 | 100 parts by mass |
| Polyester Compound B Described in Examples of JP2015-227955A | 12 parts by mass |
| Following Compound F | 2 parts by mass |
| Methylene Chloride (first solvent) | 430 parts by mass |
| Methanol (second solvent) | 64 parts by mass |

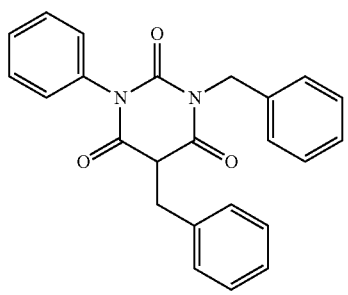

Compound F (Production of Outer Layer Cellulose Acylate Dope)

10 parts by mass of the following matting agent solution was added to 90 parts by mass of the above-described core layer cellulose acylate dope to prepare a cellulose acetate solution to be used as an outer layer cellulose acylate dope.

| Matting Agent Solution | |
|---|---|
| Silica Particles Having Average Particle Size of 20 nm (AEROSIL R972, manufactured by NIPPON AEROSIL CO., LTD.) | 2 parts by mass |
| Methylene Chloride (first solvent) | 76 parts by mass |
| Methanol (second solvent) | 11 parts by mass |
| Above Core Layer Cellulose Acylate Dope | 1 part by mass |

(Production of Cellulose Acylate Film 1)

The core layer cellulose acylate dope and the outer layer cellulose acylate dope were filtered with filter paper having an average pore size of 34 μm and a sintered metallic filter having an average pore size of 10 μm, and then the three layers of the core layer cellulose acylate dope and the outer layer cellulose acylate dopes on both sides of the core layer cellulose acylate dope were simultaneously cast on a drum at 20° C. from an outlet (band casting machine).

Next, the film was peeled off in a state in which the solvent content was about 20 mass %, and both ends in a width direction of the film were fixed by a tenter clip. The film was dried while being stretched in a transverse direction at a stretching ratio of 1.1.

Then, the film was further dried by being transported between rolls of a heat treatment device, and an optical film having a thickness of 40 μm was produced. The optical film was used as an optical film of Example 20. The in-plane retardation of the obtained cellulose acylate film 1 was 0 nm.

[Production of λ/4 Retardation Film 1]

Each photo-alignment film composition prepared previously was applied to one surface of the produced cellulose acylate film 1 using a bar coater.

After the application, the solvent was removed by drying on a hot plate at 120° C. for 1 minute, and a photoisomerization composition layer having a thickness of 0.3 μm was formed.

The obtained photoisomerization composition layer was irradiated with polarized ultraviolet rays (10 mJ/cm$^2$, using an ultra-high-pressure mercury lamp) to form a photo-alignment film.

Next, the optically anisotropic layer coating liquid prepared previously was applied to the photo-alignment film using a bar coater, and a composition layer was formed.

The formed composition layer was heated to 110° C. once on a hot plate, and then cooled to 60° C. to stabilize the alignment.

Thereafter, the temperature was maintained to 60° C., and the alignment was fixed by ultraviolet irradiation (500 mJ/cm$^2$, using an ultra-high-pressure mercury lamp) under a nitrogen atmosphere (oxygen concentration: 100 ppm) to form an optically anisotropic layer having a thickness of 2.3 μm, and a λ/4 retardation film 1 was produced. The in-plane retardation of the obtained optical laminate was 140 nm.

[Production of Positive C-Plate Film 2] A commercially available triacetyl cellulose film "Z-TAC" (manufactured by FUJIFILM Corporation) was used as a temporary support (this is referred to as a cellulose acylate film 2). A surface temperature of the cellulose acylate film 2 was increased to 40° C. by passing the film through a dielectric heating roll at a temperature of 60° C., and then an alkaline solution having the following composition was applied to one side of the film at a coating rate of 14 ml/m$^2$ using a bar coater, heated to 110° C., and transported for 10 seconds under a steam-type far-infrared heater manufactured by NORITAKE CO., LIMITED.

Next, pure water was applied using the same bar coater at 3 ml/m$^2$.

Next, water washing by a fountain coater and draining by an air knife were repeated three times, and then the film was transported to a drying zone at 70° C. for 10 seconds and dried to produce an alkali-saponified cellulose acylate film 2.

| Composition of Alkaline Solution (parts by mass) | |
| --- | --- |
| Potassium Hydroxide | 4.7 parts by mass |
| Water | 15.8 parts by mass |
| Isopropanol | 63.7 parts by mass |
| Fluorine-Containing Surfactant SF-1 ($C_{14}H_{29}O(CH_2CH_2O)_{20}H$) | 1.0 part by mass |
| Propylene Glycol | 14.8 parts by mass |

The above-described alkali-saponified cellulose acylate film 2 was used, and an alignment film forming coating liquid having the following composition was continuously applied thereto using a wire bar #8. The liquid was dried for 60 seconds by hot air at 60° C., and further dried for 120 seconds by hot air at 100° C., and an alignment film was formed.

| Composition of Alignment Film Forming Coating Liquid | |
| --- | --- |
| Polyvinyl Alcohol (manufactured by KURARAY CO., LTD., PVA103) | 2.4 parts by mass |
| Isopropyl Alcohol | 1.6 parts by mass |
| Methanol | 36 parts by mass |
| Water | 60 parts by mass |

The following coating liquid N was applied to the cellulose acylate film 2 having the alignment film produced as described above. After aging for 60 seconds at 60° C., the film was irradiated with 1,000 mJ/cm$^2$ of ultraviolet rays using an air-cooling metal halide lamp (manufactured by EYE GRAPHICS Co., Ltd.) of 70 mW/cm$^2$ in the air to fix the alignment state. Accordingly, the polymerizable rod-like liquid crystal compound was vertically aligned, and a positive C-plate film 2 was produced. Rth at a wavelength of 550 nm was −60 nm.

| Composition of Optically Anisotropic Film Coating Liquid N | |
| --- | --- |
| Following Liquid Crystalline Compound L-1 | 80 parts by mass |
| Following Liquid Crystalline Compound L-2 | 20 parts by mass |
| Following Vertical Alignment Agent (S01) | 1 part by mass |
| Ethylene Oxide-Modified Trimethylolpropane Triacrylate (V#360, manufactured by OSAKA ORGANIC CHEMICAL INDUSTRY LTD.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Following Compound B03 | 0.4 parts by mass |
| Methyl Ethyl Ketone | 170 parts by mass |
| Cyclohexanone | 30 parts by mass |

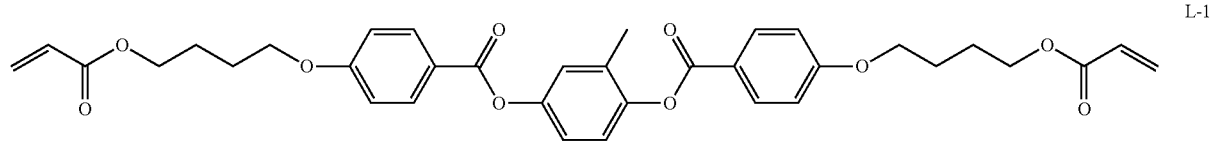

L-1

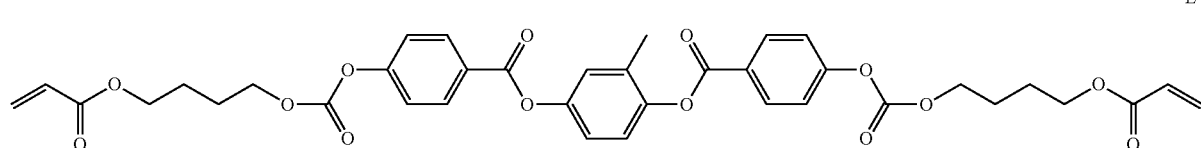

L-2

-continued

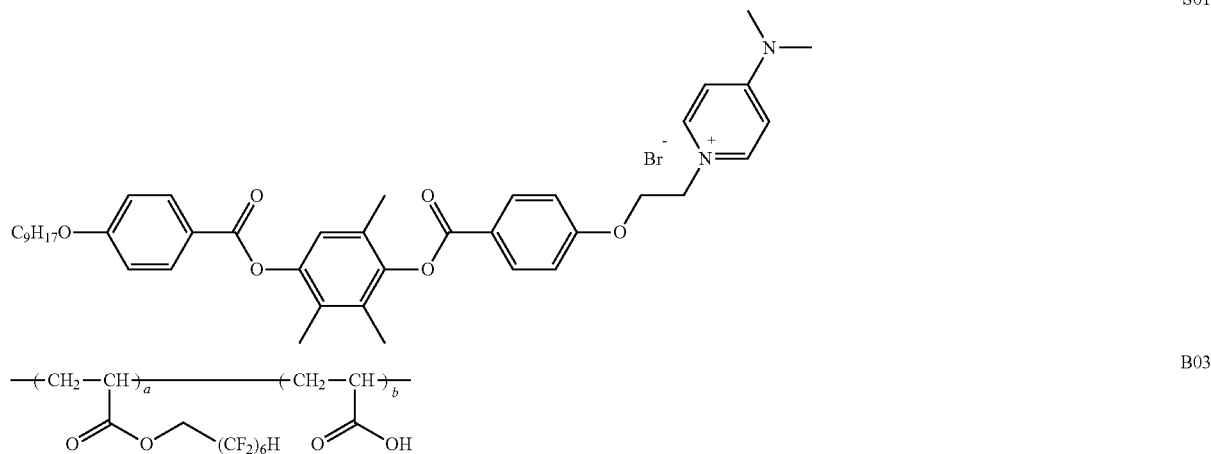

S01

B03

<Production of Circularly Polarizing Plate>

The positive C-plate film 2 produced as described above was transferred to the optically anisotropic layer side of the λ/4 retardation film 1 via a pressure sensitive adhesive, and the cellulose acylate film 2 was removed. The laminate produced in Example 1 was bonded to a side of the λ/4 retardation film on the side of the cellulose acylate film 1 via a pressure sensitive adhesive, and thus a circularly polarizing plate was obtained.

GALAXY S5 manufactured by SAMSUNG, equipped with an organic EL panel (organic EL display element), was disassembled, a touch panel with an attached circularly polarizing plate was peeled off from the organic EL display device, and the circularly polarizing plate was peeled off from the touch panel. The organic EL display element, the touch panel, and the circularly polarizing plate were isolated from each other. Next, the isolated touch panel was bonded again to the organic EL display element, the circularly polarizing plate produced as described above was bonded to the touch panel such that the positive C-plate side became the panel side, and an organic EL display device was produced.

The produced organic EL display device was evaluated in the same manner as in a case where PURE-ACE WR (manufactured by TEIJIN LIMITED) was used as a λ/4 plate, and it was confirmed that the same effects were exhibited even in a case where the laminate of the λ/4 retardation film 1 and the positive C-plate film 2 was used as the λ/4 plate.

EXPLANATION OF REFERENCES 10, 20, 30: laminate
12: transparent support
14: alignment film
16: light absorption anisotropic film
18: transparent resin layer

What is claimed is:

1. A laminate comprising, in this order:
   a transparent support;
   a light absorption anisotropic film; and
   a transparent resin layer,
   wherein the light absorption anisotropic film is a film containing a dichroic substance represented by Formula (1), and
   the transparent resin layer is a layer containing a polymer which has a hydrophilic group and does not have a glass transition temperature in a temperature range of 95° C. or lower,

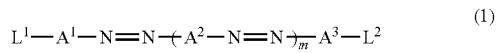

(1)

in Formula (1), $A^1$, $A^2$, and $A^3$ each independently represent a divalent aromatic group which may have a substituent,
in Formula (1), $L^1$ and $L^2$ each independently represent a substituent, and
in Formula (1), m represents an integer of 1 to 4, and in a case where m is an integer of 2 to 4, a plurality of $A^2$'s may be the same as or different.

2. The laminate according to claim 1,
wherein a content of the polymer in the transparent resin layer is 30 mass % or greater with respect to a total mass of a total solid content of the transparent resin layer.

3. The laminate according to claim 1,
wherein the polymer in the transparent resin layer is a polymer in which a ratio of the number of the hydrophilic groups to the number of carbon atoms having a C—H bond is 0.05 to 0.45.

4. The laminate according to claim 1,
wherein a water contact angle of a surface of the transparent resin layer opposite to the light absorption anisotropic film is 25° or greater and 60° or less.

5. The laminate according to claim 1,
wherein the light absorption anisotropic film is a film formed using a liquid crystal composition containing the dichroic substance and a liquid crystalline compound.

6. The laminate according to claim 1, further comprising:
an alignment film provided between the transparent support and the light absorption anisotropic film.

7. The laminate according to claim 6,
wherein the alignment film is a photo-alignment film formed using a composition containing a photo-alignment compound, the photo-alignment compound is a photosensitive compound having a photoreactive group which generates at least one of dimerization or isomerization by the action of light, and the photoreactive group has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

8. The laminate according to claim 1,
wherein the dichroic substance has a structure represented by Formula (2),

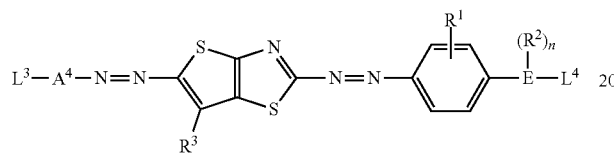

(2)

in Formula (2), $A^4$ represents a divalent aromatic group which may have a substituent, in Formula (2), $L^3$ and $L^4$ each independently represent a substituent, in Formula (2), E represents any one of a nitrogen atom, an oxygen atom, or a sulfur atom, in Formula (2), $R^1$ represents any one of a hydrogen atom, a halogen atom, an alkyl group which may have a substituent, or an alkoxy group which may have a substituent, in Formula (2), $R^2$ represents a hydrogen atom or an alkyl group which may have a substituent, in Formula (2), $R^3$ represents a hydrogen atom or a substituent, in Formula (2), n represents 0 or 1, and in a case where E is a nitrogen atom, n is 1, and in a case where E is an oxygen atom or a sulfur atom, n is 0.

9. The laminate according to claim 8,
wherein in Formula (2), $A^4$ is a phenylene group.

10. The laminate according to claim 8,
wherein in Formula (2), at least one of $L^3$ or $L^4$ contains a crosslinking group.

11. The laminate according to claim 8,
wherein in Formula (2), both $L^3$ and $L^4$ contain a crosslinking group.

12. The laminate according to claim 10,
wherein the crosslinking group is an acryloyl group or a methacryloyl group.

13. The laminate according to claim 1, further comprising:
a pressure sensitive layer provided on a side of the transparent resin layer opposite to the light absorption anisotropic film.

14. The laminate according to claim 13, further comprising:
a λ/4 plate provided on a side of the pressure sensitive layer opposite to the transparent resin layer.

15. A manufacturing method of a laminate which has a transparent support, a light absorption anisotropic film, and a transparent resin layer in this order, the method comprising:
a light absorption anisotropic film forming step of forming a light absorption anisotropic film using a liquid crystal composition containing a dichroic substance represented by Formula (1) on a transparent support; and
a transparent resin layer forming step of forming a transparent resin layer containing a polymer which has a hydrophilic group and does not have a glass transition temperature in a temperature range of 95° C. or lower using a curable composition containing a polymerizable compound having a hydrophilic group on the light absorption anisotropic film,

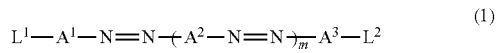

(1)

in Formula (1), $A^1$, $A^2$, and $A^3$ each independently represent a divalent aromatic group which may have a substituent, in Formula (1), $L^1$ and $L^2$ each independently represent a substituent, and in Formula (1), m represents an integer of 1 to 4, and in a case where m is an integer of 2 to 4, a plurality of $A^2$'s may be the same as or different.

16. The manufacturing method of a laminate according to claim 15,
wherein a C log P value of the polymerizable compound is less than 2.0.

17. The manufacturing method of a laminate according to claim 16,
wherein the polymerizable compound is a compound in which a ratio of the number of the hydrophilic groups to the number of carbon atoms having a C—H bond is 0.05 to 0.45.

18. An image display device comprising:
the laminate according to claim 1.

19. An image display device comprising:
the laminate according to claim 2.

20. An image display device comprising:
the laminate according to claim 3.

* * * * *